United States Patent
Davis et al.

(12)

(10) Patent No.: US 6,173,750 B1
(45) Date of Patent: *Jan. 16, 2001

(54) METHOD AND APPARATUS FOR REMOVING DIE FROM A WAFER AND CONVEYING DIE TO A PICKUP LOCATION

(75) Inventors: Peter Davis, Santa Cruz; Dean Tarrant, San Jose, both of CA (US)

(73) Assignee: Hover-Davis, Inc., Spencerport, NY (US)

( * ) Notice: Under 35 U.S.C. 154(b), the term of this patent shall be extended for 0 days.

This patent is subject to a terminal disclaimer.

(21) Appl. No.: 09/251,541

(22) Filed: Feb. 17, 1999

Related U.S. Application Data

(63) Continuation-in-part of application No. 09/025,564, filed on Feb. 18, 1998, now Pat. No. 5,976,306, and a continuation-in-part of application No. 09/033,269, filed on Mar. 2, 1998, now abandoned.

(51) Int. Cl.$^7$ ............................................. lp;1pB32B 35/00

(52) U.S. Cl. ......................... 156/584; 156/344; 29/426.3; 29/426.6; 438/464

(58) Field of Search ..................................... 156/344, 584; 438/33, 68, 113, 114, 464, 465, 976, FOR 38; 29/426.1, 426.3, 426.5, 426.6, 762

(56) References Cited

U.S. PATENT DOCUMENTS

| | | |
|---|---|---|
| 4,437,232 | 3/1984 | Araki et al. . |
| 4,876,791 | 10/1989 | Michaud et al. . |
| 5,671,530 | 9/1997 | Combs et al. . |
| 5,976,306 | * 11/1999 | Davis et al. ........................ 156/344 |

FOREIGN PATENT DOCUMENTS

WO 97/32460    9/1997   (WO) .

OTHER PUBLICATIONS

English Abstract from Derwent of WO 9732460.

Newsome, Robert; "Meeting the Increasing Demands of Assembling Advanced Packages," Electronic Packaging & Production, Jan., 1988, pp. 38–44.

Mullens, Brian; "Chip–on–Board Assembly Methods," Electronic Packaging & Production, Apr., 1997; pp. 47–50.

* cited by examiner

*Primary Examiner*—Mark A. Osele
(74) *Attorney, Agent, or Firm*—Leonard Heyman; Duane C. Basch

(57) ABSTRACT

A direct die feeder picks known good die from a wafer and places them on a conveyor belt, which conveys the die to a pickup location. Frame (111) supports a wafer (105) which is a wafer that is sawed while adhered onto a flexible film, which is then stretched and mounted in a ring (110). A fork member (125), on which a pick head (150) is mounted slides along a horizontal axis and frame (111) slides along a vertical axis to allow the pick head (150) to access any die from the wafer. A camera (160) is directed downward at a 45° mirror (162) adjacent to the pick head to capture images of the wafer and determine the precise locations of die and qualify them. The pick head (150) can pick die from the wafer and place them directly on the conveyor belt (170) in the conventional orientation, or pass the die to a flip head (140) which then shifts to the left and lowers the die down past the pick head, placing the die on the conveyor belt in the flipped orientation. The conveyor belt operates until a die is detected at a pickup location (173) at one end of the conveyor except during placing operations of the pick head or flip head or during burst mode operations, during which the conveyor belt is loaded with closely spaced die, then fed in rapid succession to a multi-head host pick and place machine.

60 Claims, 15 Drawing Sheets

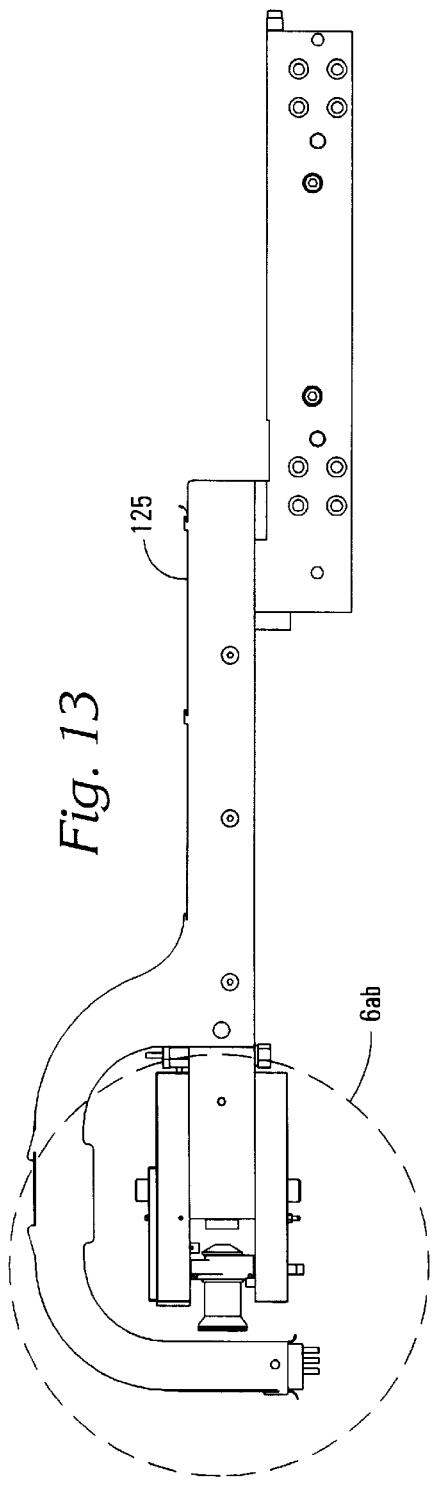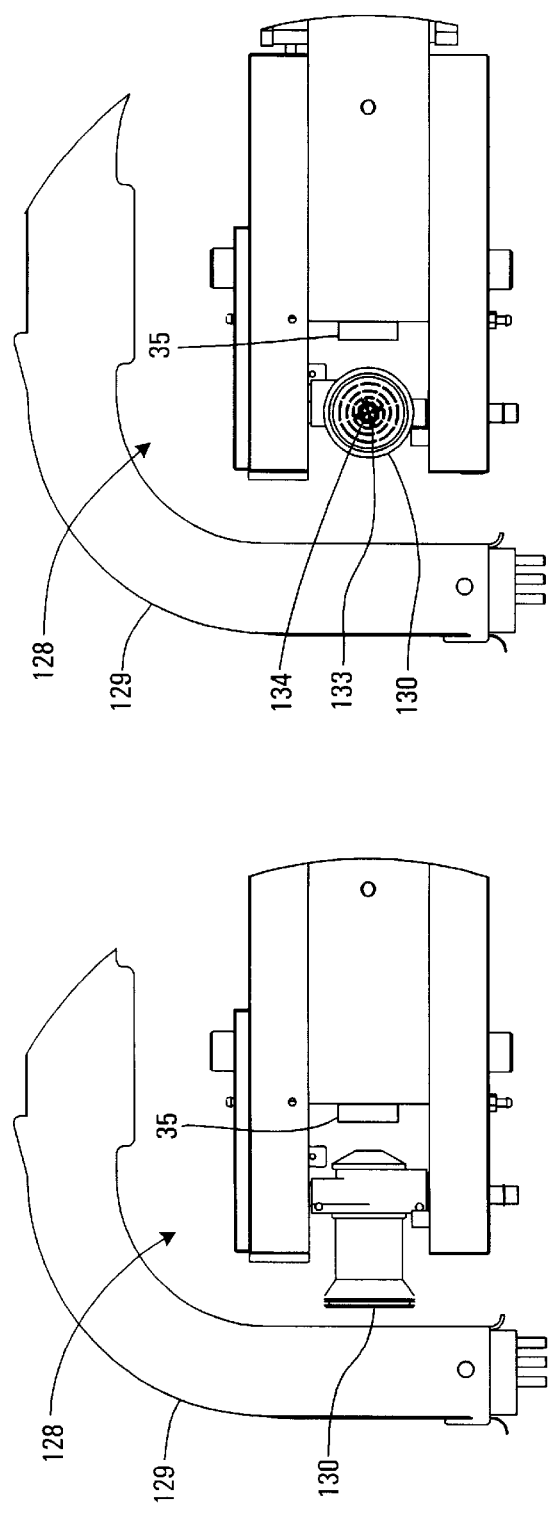
Fig. 13
Fig. 13a
Fig. 13b

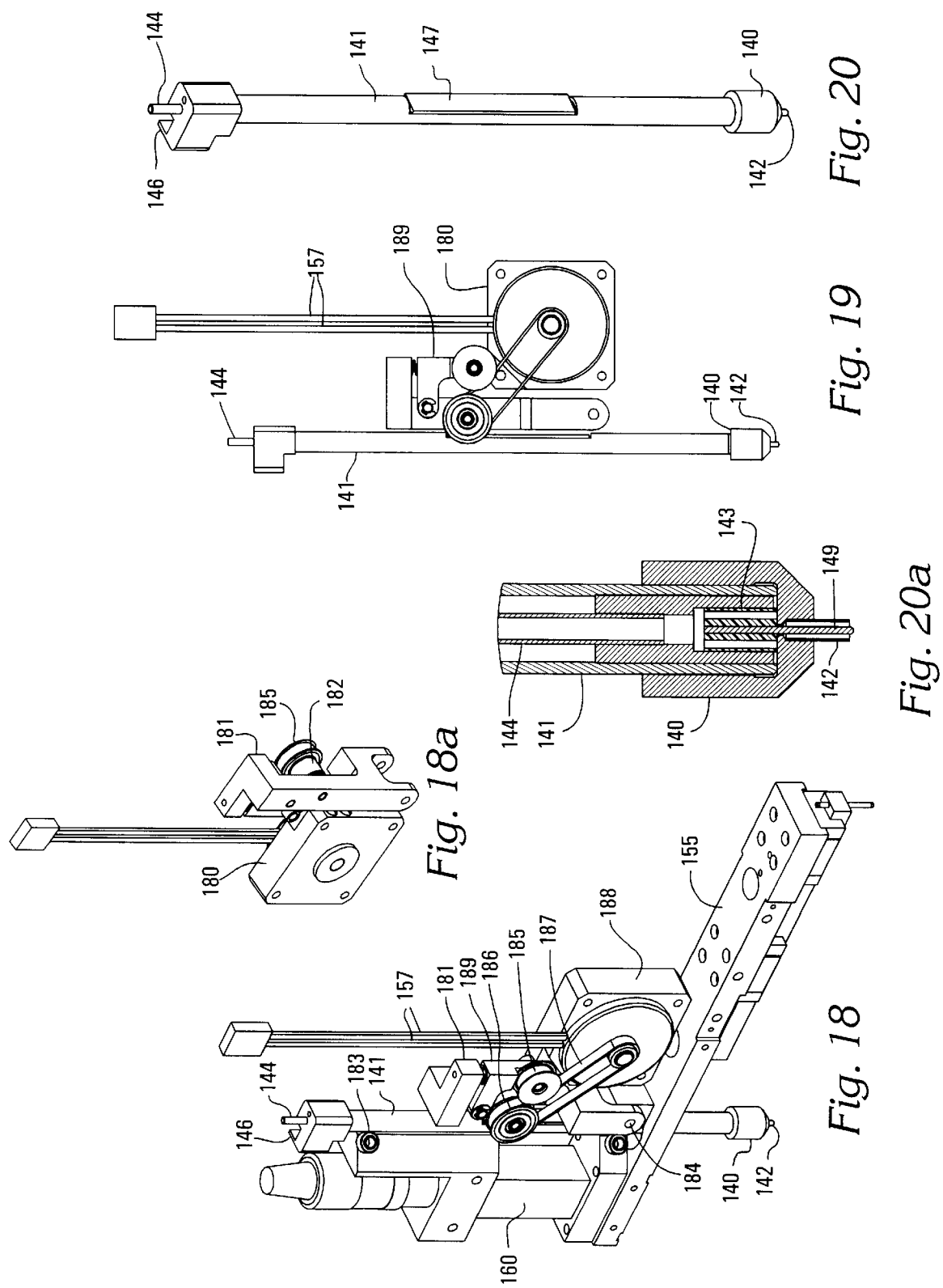

METHOD AND APPARATUS FOR REMOVING DIE FROM A WAFER AND CONVEYING DIE TO A PICKUP LOCATION

This application is a continuation-in-part of both U.S. patent application Ser. No. 09/025,564 filed Feb. 18, 1998 now U.S. Pat. No. 5,976,306 and U.S. patent application Ser. No. 09/033,269 filed Mar. 2, 1998 now abandoned.

BACKGROUND OF THE INVENTION

This invention relates generally to the manufacture of circuit boards, more particularly, the surface mounting of integrated circuits (ICs) on substrates including printed circuit boards and other platforms where components are mounted and connected. More particularly, the invention relates to a die feeder device that performs the function of removing each known good die from a sawed wafer disposed on a flexible adhesive film, placing the die on a conveyer, and conveying the die to a pick-up location.

In the mass production of printed circuit boards having a plurality of ICs surface-mounted thereon, automated machinery accept die from feeders and then mount them at a predetermined location on the circuit board. The die feeders have previously taken the form of tape-and-reel-type feeders (tape feeders) which remove the die from a plastic tape and present them to the host automated assembly machine. An example of a reel type tape feeder is shown in U.S. Pat. No. 4,437,232, issued to Araki et al. on Mar. 20, 1984. One advantage of the tape feeders is that they take up a small amount of space during the assembly of the circuit board, thus a large number of tape feeders can be placed adjacent to one another and utilized by a single assembly machine. Additionally, tape feeders are relatively simple in operation and are capable of feeding die reliably at a very rapid pace. The present invention takes the place of these tape feeders and obviates the steps of placing die onto the plastic tape then removing them from the plastic tape. The present invention is capable of performing this function of presenting die serially directly from a wafer without taking up significantly more space than a tape feeder. For this reason, it is called a direct die feeder, or DDF. By reducing the handling of bare die on its journey from wafer to assembly, significant expense reduction is realized, and the opportunity for damage to individual die is reduced, which improves the reliability of the end product.

Because the present invention is intended to replace current tape feeders, it is designed to maintain the narrow form-factor width standard of 80 mm which is standard in the industry. The narrow width enables many direct die feeders of the present invention to be positioned side by side (or along with tape feeders) and thus accessible by a single pick and place machine. By maintaining the narrow form-factor, fewer pick and place machines are needed as well as fewer pick and place stations in the assembly line. This significantly affects the overall cost and time consumed in the production of each unit. Maintaining this narrow profile required many design innovations herein disclosed.

The present invention represents a significant departure from the established practice of packaging dies in carrier tapes, shipping the die in the carrier tapes to a circuit board manufacturer, and then feeding the tapes to pick and place machines. When using the present invention, each die is picked from the wafer and presented directly to the host automated pick and place machine via a conveyor.

The feeder can also replace matrix trays to present parts to the host pick and place machine. The tray feeders represent a considerable expense as they take up a large section of the host machine interface as well as the cost of buying and stuffing trays.

Wafers usable by this invention are provided in a manner which is standard in the industry. A wafer which has been etched to form the micro-electric circuitry thereon is placed on a flexible adhesive film which holds the wafer in place during a sawing (or "dicing") operation. The adhesive film is mounted in a ring which holds the flexible film during removal of the die. Ordinarily, the wafer is "expanded", which means that the flexible adhesive film is stretched after dicing so that individual die spread out from one another. The mounting ring is used to maintain the flexible film in the stretched state. An expanded ring is characterized by an enlarged gap between adjacent dies, which improve the reliability of die extraction and prevents "chip-out" (damage to the picked die or adjacent die caused by scraping the die edges during pick-up).

A machine vision system is employed by the present invention to perform die recognition using the die edges, which requires gaps between the die, permitting them to be perceived by a visual imaging apparatus. The gaps caused by the dicing operation, without further expansion, is often sufficient to enable the chips to be reliably recognized and removed by the present invention, although it is recommended that the wafer be expanded prior to removing die.

Prior attempts at delivering chips directly from wafer to circuit board have either not been successfully implemented or industry has not accepted them. Presumably, lack of interest in the industry resulted from the failure of previous attempts to provide the specific features required by the industry, such as the high speed and small footprint currently made possible by tape feeders.

For example, U.S. Pat. No. 4,876,791 to Michaud et al. discloses an apparatus for removing die from an expanded wafer and placing the die on a substrate. This patent teaches holding the expanded wafer horizontally with the wafer side facing down. A pick and place head is positioned beneath the wafer and above the horizontally-disposed substrate. This configuration permits the pick and place head to remove the die from the wafer and place it on the substrate with minimal movement. However, it suffers from the disadvantage that it is not compatible with existing assembly machinery and requires a significant amount of horizontal real estate. In using the apparatus described in the Michaud et al. patent, the substrate must make a separate stop beneath each wafer and a separate mounting apparatus must be utilized for each chip to be placed on the substrate. The time and expense of using a separate machine for each die installed on the substrate and the space requirements of such an operation make this patent impractical for most assembly operations. Additionally, the horizontal orientation of the Michaud et al. patent is impractical for wafers having a diameter greater than 300 mm due to sagging of the wafer in the center which makes large wafers difficult to handle horizontally.

U.S. Pat. No. 5,671,530 to Combs et al. discloses an apparatus which removes die from an expanded wafer oriented vertically for use in the environment intended for the present invention. The patent to Combs et al., however, suffers from the disadvantages of only being capable of handling one die at a time using pick and place head assembly 104 shown in FIG. 6 of the Combs et al. patent. Pick and place head assembly 104 travels from a pickup location 96 to a transfer location 106. Head assembly 104 cannot return to the pickup location 96 until the circuit board assembly machinery takes the die at transfer location 106.

This pick-move-transfer-move-pick cycle is extremely time-inefficient, making the system impractical for many customers who mass produce circuit boards. It is important to understand that the conveyor shown in the Combs et al. patent operates to transport printed circuit boards (referred to as "substrates") during assembly, not to transport bare die to a pickup location as does the conveyor of the current invention.

The Combs et al. patent also suffers from the disadvantage of only being able to present chips in a "flipped" (circuit-down) orientation. There are currently two primary methods of surface-mounting chips onto a substrate or circuit board. The conventional wire-bond or tape-bond methods includes placing the chip on the substrate in the conventional, circuit-up orientation, and electrical connections being made from electrical contacts on the top of the chip to contacts on the substrate using metal wires or tape. The flip-chip method includes forming solder bumps on the art side of the die, then placing the die, circuit-down on the substrate, aligning the solder bumps on the die with metal contacts on the substrate and holding the die in position while electrical and mechanical connection is made by reflowing the solder bumps. The Combs et al. invention is limited by only being capable of presenting chips in the flipped, or circuit-down, orientation.

SUMMARY OF THE INVENTION

The present invention overcomes the disadvantages of the prior art noted above. The direct die feeder of the present invention takes the place of conventional tape and tray feeders, and is therefore compatible with existing assembly machinery. As with tape feeders, the use of the direct die feeder is not limited to feeding die; it can feed any type of component positioned on a flexible film. Thus, for the purpose of this invention, use of the word, "die" generally refers to any type of component mounted to a flexible film.

Through the use of a novel conveyor belt, die may be transported to the pickup location while the pick-head assembly is busy removing more die from the wafer. Additionally, a novel flip head is selectively operable to accept a die from the pick head and then place the die in the flipped position on the conveyor. Alternatively, the pick head can place the die directly on the conveyor in the conventional orientation if required. Thus, the present invention is capable of presenting the die in the proper orientation for either the conventional or the flipped methods of mounting.

The die conveyor extends substantially the full length of the feeder traversing the entire wafer. This feature minimizes pick head movement as it removes die from the wafer and places them at any convenient location on the conveyor. The pick head is thus limited to two short 10 mm strokes in order to remove and register a die to the transport system where the transportation of the die is done in parallel to the picking. Prior attempts have incorporated the transport system in the pick and place mechanism resulted in requiring the die to by moved 300 mm or more to their final destination which requires a very substantial mechanism to perform this movement quickly. Such a device would be too large and bulky to fit into the narrow form factor required by the industry. The reduced motion of the pick head of the present invention translates into rapid die removal from the wafer that operates in the narrow form factor and is energy efficient.

The conveyor also facilitates buffering of die to the extraction point, which permits an assembly machine to take a cluster of die from the conveyor in rapid succession if it has that capability. By accepting a cluster of die in rapid succession using, for example, a rotary pick and place head assembly, the assembly machine can operate at peak efficiency. While the assembly machine is busy installing the chips on the circuit boards, the chip feeder will pick die off the wafer and place them on the conveyer, loading the conveyer for the mounting heads' return to take the next cluster of die from the feeder. Buffering of die also provides the practical advantage of being able to exchange wafers without shutting down the line.

These and other advantages of the present invention will become clear in the following Detailed Description of the Preferred Embodiment.

BRIEF DESCRIPTION OF THE DRAWINGS

FIG. 12d shows a detail of the flip head shifted to the left and fully extended to the belt for placing a die on the belt in the flipped orientation.

FIG. 13 shows the strip arm as viewed from the side of the wafer.

FIGS. 13a and 13b show a detail of the strip arm of FIG. 4 showing the movement of the strip head.

FIG. 18 shows in a perspective view the flip head with motor and drive assembly for raising and lowering the flip head.

FIG. 18a is a reverse angle of the motor and drive assembly of FIG. 18.

FIG. 19 shows the motor and drive assembly in elevation.

FIG. 20 shows the flip head in perspective view.

FIG. 20a shows a center cross section detail of the bottom portion of the flip head shown in FIG. 20.

DETAILED DESCRIPTION OF THE PREFERRED EMBODIMENT

Figure 1:
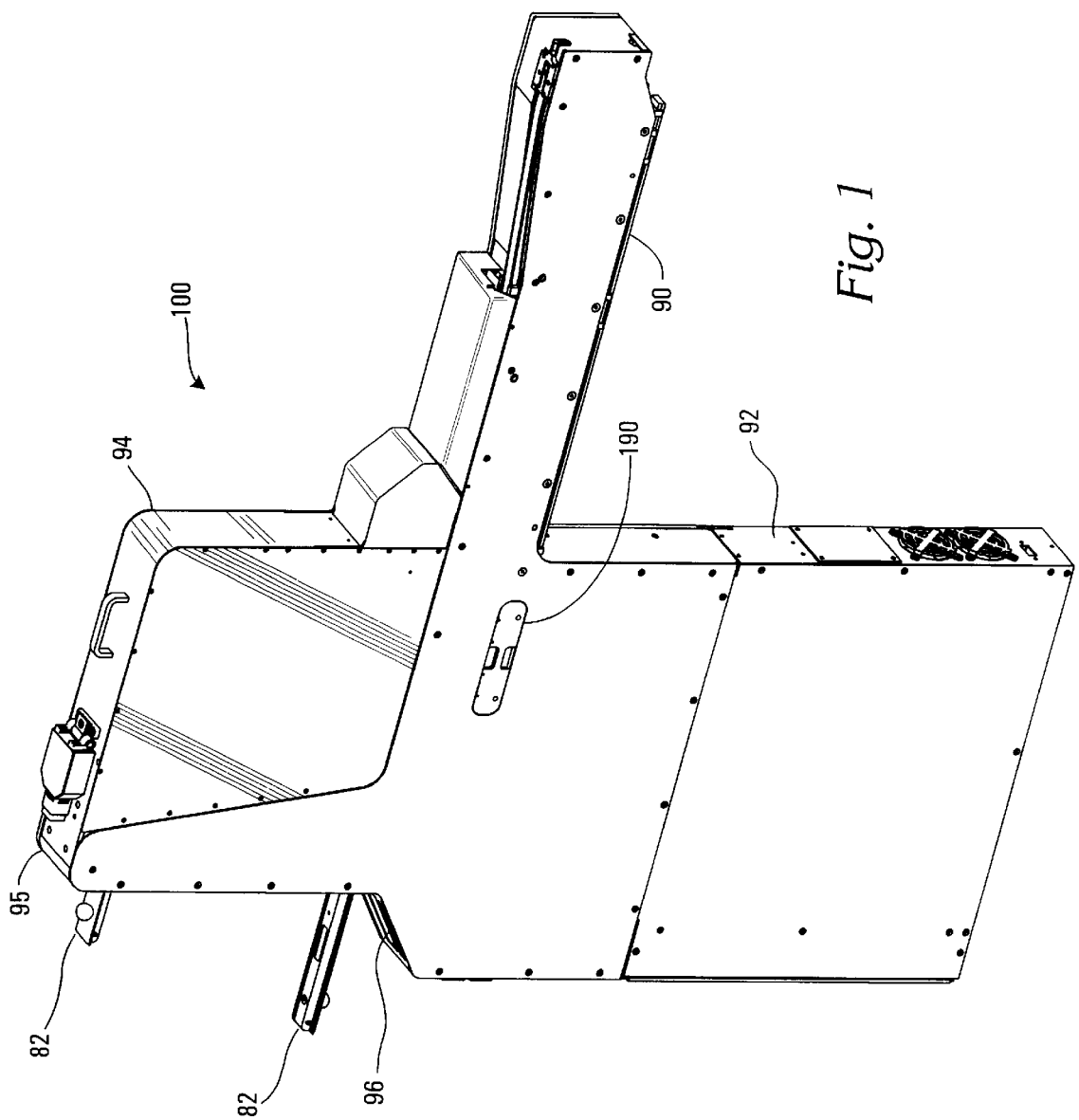
FIG. 1 shows the invention, fully assembled, in a false-perspective, isometric view.
Figure 37:
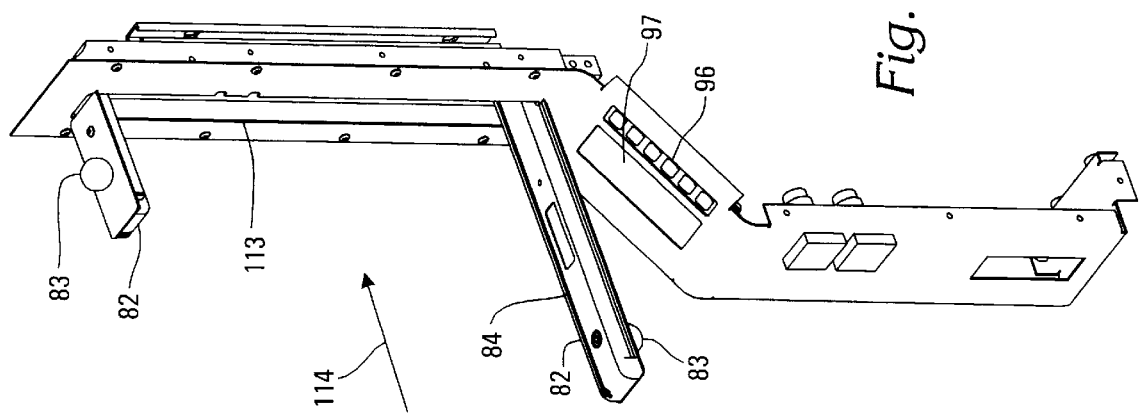
FIG. 37 is a perspective view of the back panel, showing the wafer doors and control panel.

FIG. 1 shows the fully assembled direct die feeder 100 in a false-perspective, isometric view. Direct die feeder 100 includes a service access 94 which is transparent to allow viewing of the operation of the invention. Service access 94 pivots upward at hinge 95 to permit periodic maintenance and servicing of the moving parts inside. Cabinet 92 houses the control unit 101 and associated control systems, such as pneumatic control assembly 106. A control panel 96, shown in FIGS. 1 and 37, is provided which controls the function of the apparatus, which can also be controlled remotely through a network connection. The direct die feeder 100 mounts to the host assembly machine using rails 90, which allow the direct die feeder to slide out from between other feeders making it accessible for servicing.

Figure 2:
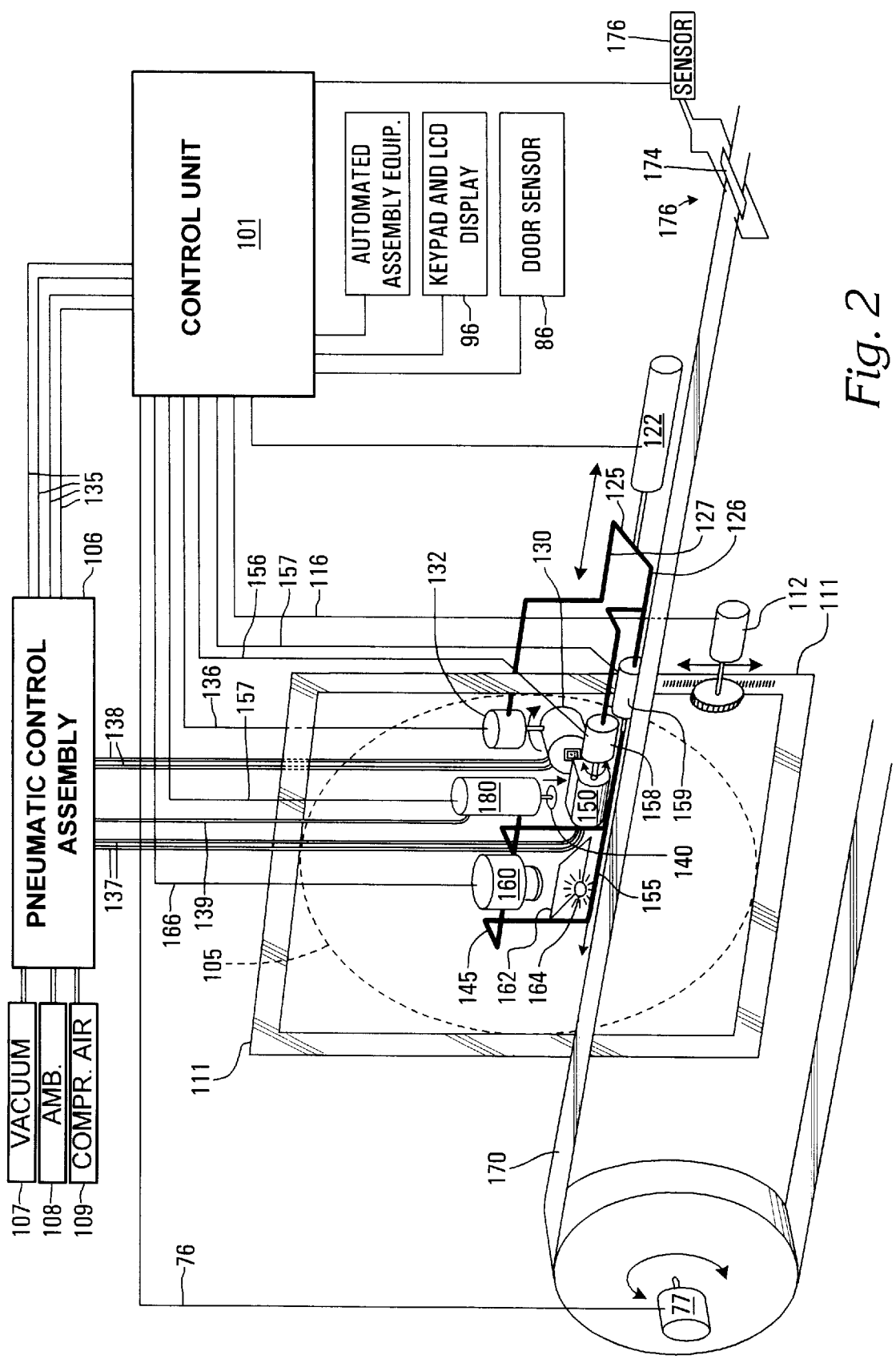
FIG. 2 is a schematic representation of the invention showing the control system and major moving parts.

FIG. 2 provides a schematic representation of the main working parts and control system of the invention. The major components of the invention include wafer frame 111, conveyor 170, die strip head 130, pick head 150, flip head 140, machine vision camera 160, and control unit 101. The basic operation of this system is best understood with reference to the schematic representation of the invention shown in FIG. 2, however reference should also be made to FIG. 3 which shows the working parts after certain covers and components are removed.

FIG. 2 incorporates the following conventions to clearly show the important moving parts of the invention: Each actuator is represented as a cylindrical body having rod extending therefrom which either translates along the axis of the cylindrical body or rotates on the axis of the cylindrical body. The motion of each actuator or the part it moves is indicated with an arrow near the actuator. Occasionally, the arrow is shown adjacent to the part actuated. Structural supports are represented with thick black lines. By no means is this drawing to scale, and of course actuators shown as translating actuators could be replaced with rotating actuators with rack-and-pinion gearing or other means to create a translating motion, and vice-versa. The parts in this diagram are spread out to provide room to clearly show each part and its movements. Wafer 105 is shown in phantom so that parts positioned behind the wafer, including die strip head 130, die strip head actuator 132, and associated control lines and support structures could be clearly shown. It should also be understood, however, that the wafer itself in not part of this invention.

Figure 38:
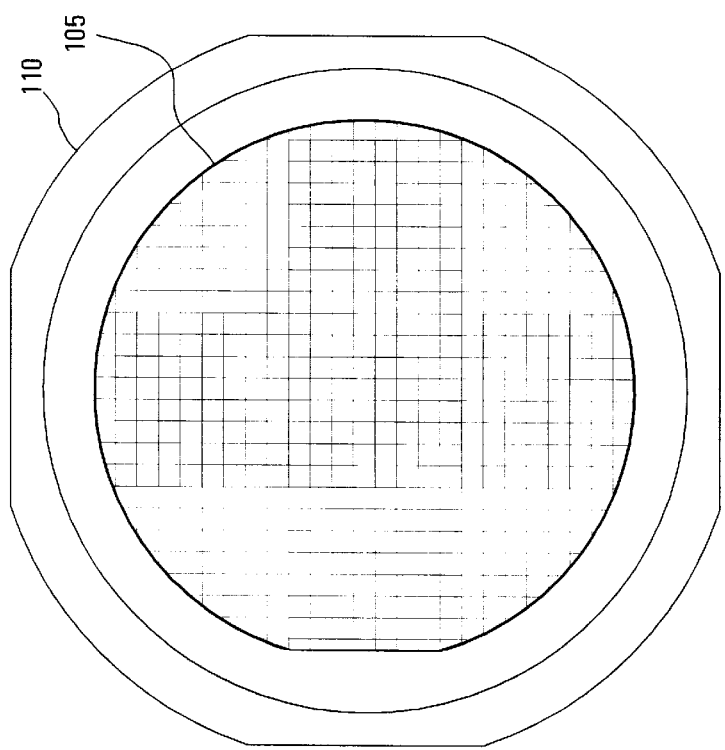
FIG. 38 is an example of a wafer in a mounting ring.

Wafer 105 is an expanded 8 inch wafer, however the frame 111 can also position other sized wafers, and the invention can be modified to accept larger wafers. Wafers are expanded by stretching the flexible film to which the sawed wafer is attached, causing each chip on the film to move away from its neighbors. Once the film is stretched, it is placed in a wafer ring 110 (see FIG. 38) which clamps the film between two component rings. Although recommended, wafers are often not required to be expanded prior to being loaded into direct die feeder 100 in order for the feeder to function properly. Regardless of whether the wafer is expanded, it must be supported in a ring 110 that is compatible with frame 111 of the device.

Figure 3:
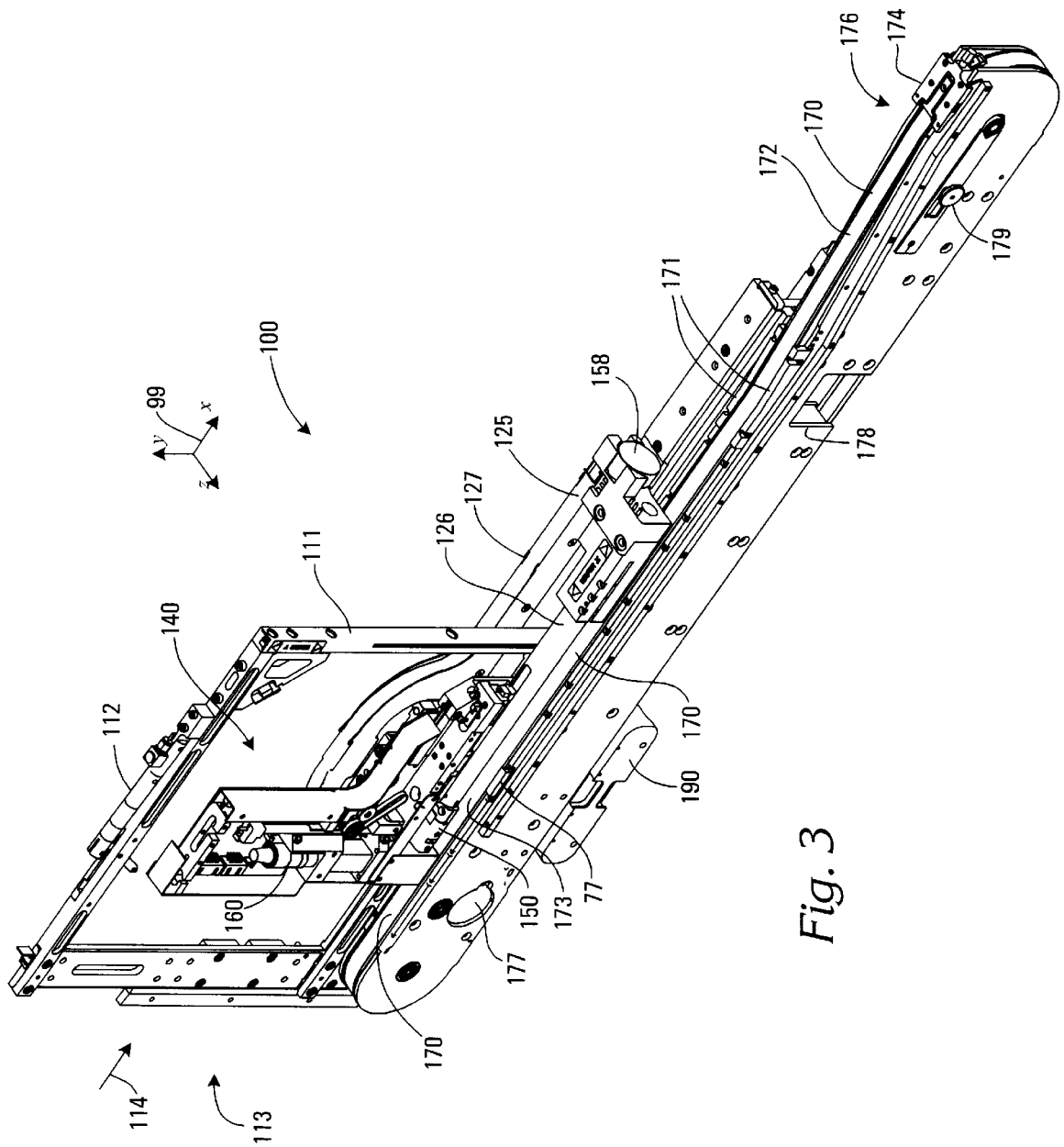
FIG. 3 shows certain novel components of the preferred embodiment of the present invention in perspective view, with obstructing covers and components removed.

Referring now to FIGS. 3 and 37, wafer 105 is inserted through wafer access 113 in the direction of arrow 114, in a manner more particularly described below. Wafer 105 is positioned vertically in frame 111, but this is not a mandatory orientation. While the vertical orientation minimizes the horizontal reach of the profile, the frame can operate at any angle as it rotates on an axis that is parallel to conveyor 170. After wafer 105 is positioned in frame 111, clamp 112 actuates to lock wafer 105 in place.

The operation of the apparatus is controlled by control unit 101, shown in FIG. 2, which may consist of a general purpose computer system equipped with multiple i/o ports for sending and receiving signals from the various sensors and actuators. Although the signal pathways are each represented in FIG. 2 with a single fine line, it should be understood that each may consist of more than one electrical wire to and from each actuator or sensor, and in the case of actuators, the single line may also represent feedback lines from verification sensors. In the preferred embodiment, many of the actuators are electromechanical, but some are preferred to be pneumatically actuated. As is well known in the art, pneumatic control is effectuated through the use of control lines 135 which operate solenoid-controlled valves (not shown) in pneumatic control assembly 106, which connects each of pneumatic control lines 157 and 137 with either a vacuum source 107, ambient atmospheric pressure source 108, or compressed air source 109 as required.

Control unit 101 receives input from a variety of sources, including an external advance signal generated by the host automated assembly machine 172, die placement sensor 176 which detects die when present at the extraction point, user input from keypad 96, door and service sensors 86, and video input signal 166 from video camera 160.

Figure 4:
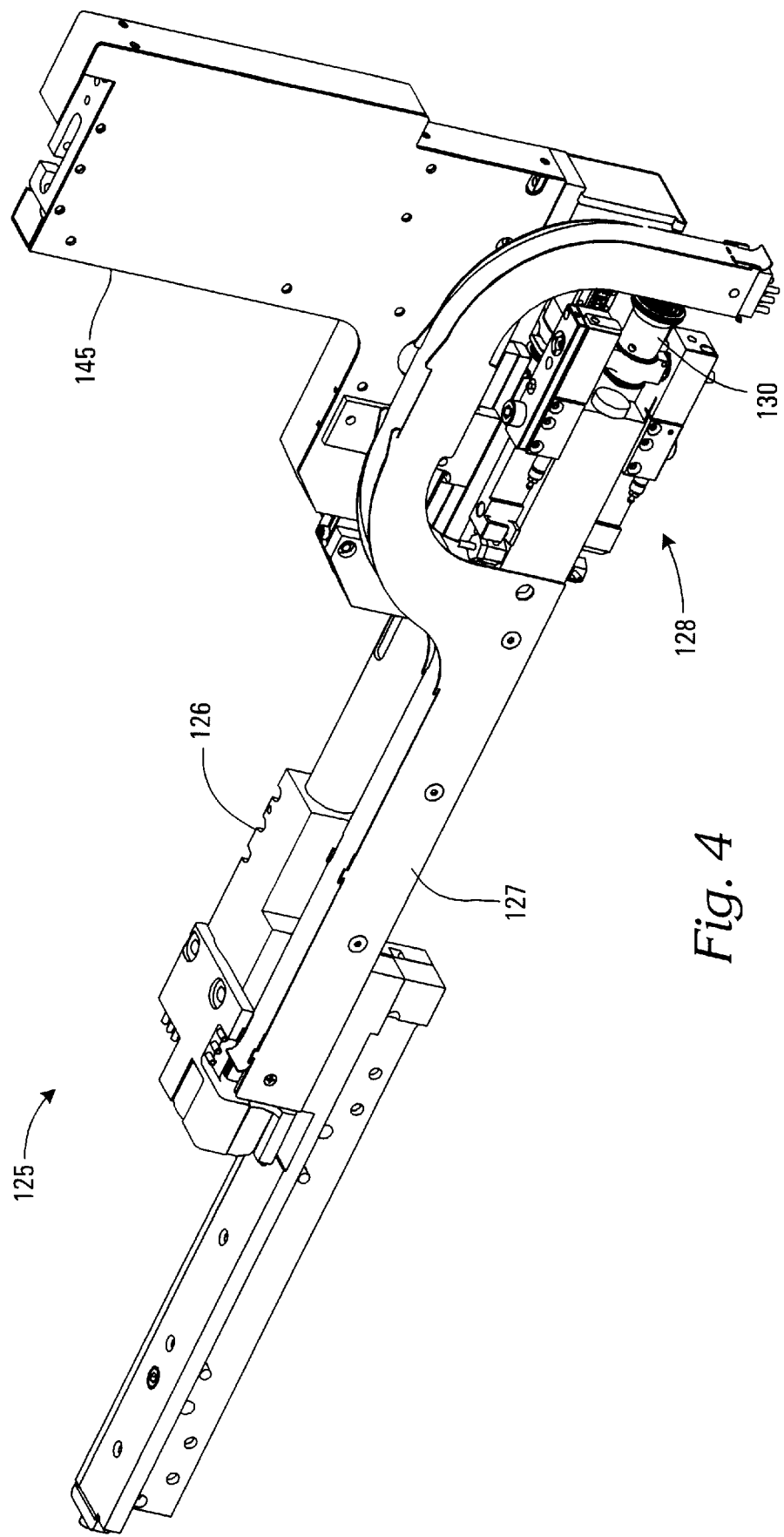
FIG. 4 shows the fork assembly of the invention shown in FIG. 1 from a reverse angle.
Figure 5:
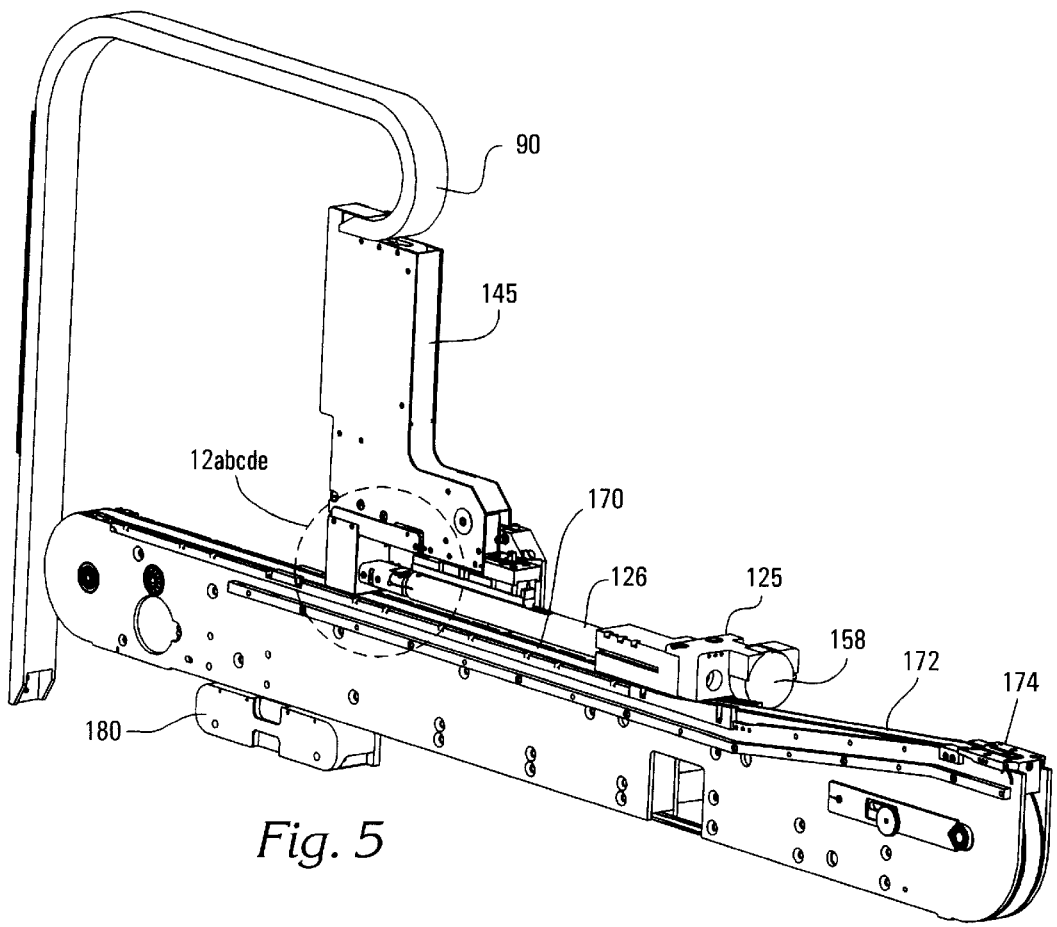
FIG. 5 shows the conveyor and pick head arm of the fork assembly of FIG. 4 with the strip arm removed.
Figure 6:
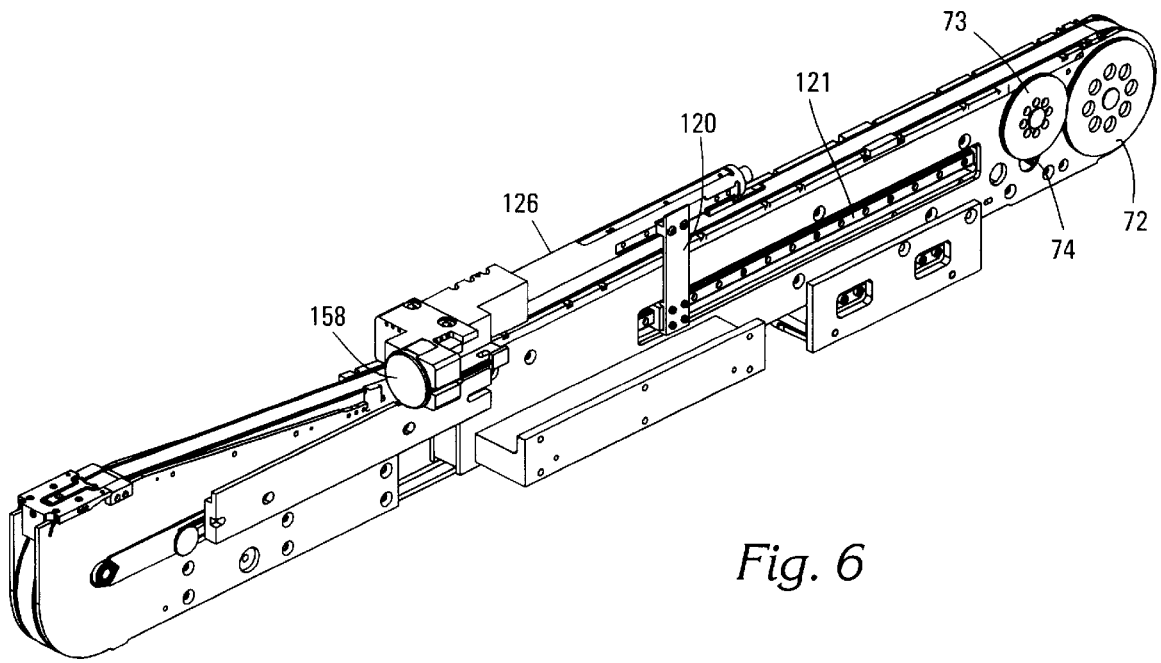
FIG. 6 shows a reverse angle of the conveyor and pick head arm shown in FIG. 5 with camera and flip head assembly removed to show outrigging support structure.

To position a selected die at the correct y-coordinate for extraction, frame 111 raises or lowers wafer 105 in response to commands from a control unit 101 to rotary actuator 112 via control line 116. Fork-shaped support 125, seen in FIGS. 2, 3, and 4, includes die strip arm 127 shown in FIGS. 2, 3, 4, and 13–17, which is positioned on the back side of wafer frame 111 as it is viewed in FIGS. 2 and 3. Fork-shaped support 125 also includes a pick head assembly arm 126 seen in FIGS. 2–6 which is positioned on the front side of wafer frame 111 as it is viewed in FIGS. 2 and 3. FIG. 6, which shows pick arm 126 from a reverse angle, shows outrigging support 120, which provides extra support to the pick arm for increased stiffness, thereby preventing unwanted vibrations during pick operations. Outrigging support 120 rides on rail 121 mounted on the back side of the conveyor assembly.

In FIG. 2, fork-shaped support 125, including die strip arm 127 and pick head assembly arm 126 are represented using thick lines. Die strip arm 127 and pick head assembly arm 126 are mechanically connected and move as a unit in the x-direction to maintain alignment between the pick head 150 and strip head 130.

As discussed above, the principal purpose of this invention is to remove die from a wafer, and place them on a conveyor belt whereupon they are conveyed to a pickup location. The process of locating known good die and removing them from a wafer is well known in the art, but is not normally performed with the wafer oriented vertically and it was heretofore unknown to do so in the tight confines of a 80 mm form factor. To overcome obstacles in performing this feat, a number of innovations in design and engineering were employed relating to the operation of the pick head, strip head, flip head, and machine vision system.

Of course, the die removal process can be used for purposes other than placing die on a conveyor belt. For example, die removal could be carried out for stuffing carrier tape or matrix trays with die for packaging, or for delivering directly to a host pick and place machine. Use of the narrow form factor machine herein disclosed for picking and stuffing die in either carrier tape or matrix trays provides for efficient use of production space. If the tape or trays are to be fed directly to a host machine, almost unlimited buffering of the components can be realized. Likewise, the conveyor belt represents a significantly improved means of conveying dies and other small objects to a specific location with a high degree of precision and accuracy. Thus, the knowledgeable reader will understand that the die removal apparatus and the conveyor belt herein disclosed have separate and distinct utility.

Before removing a selected die it is desirable to know its exact location as well as its status as good or bad so that only good die or die of the correct grade are removed and used leaving disqualified die behind to be dispensed later or discarded with the spent wafer. Two basic methods are commonly employed during the testing process to indicate die quality for down stream processes. The first and most common uses ink dots to mark bad die. Typically the ink dots are black, but they can be of other colors as well. The second method is array mapping of the wafer, in which the physical location of each die, and its status or grade is provided along with the wafer. Using the on board machine vision system the invention can detect ink dots to disqualify die. Additionally, the invention may incorporate off the shelf color and luster comparison to detect ink dots by scanning die for net average variances from a known reference. Technology supports processing of pre-mapped wafers, i.e., wafers provided with maps generated during testing of the wafer that disclose array locations of known good die. By pre-map removal of a reference fiducial die off-line as part of the wafer expansion step, a suitably durable scheme could be employed using edge detection technology to reference an array starting point.

The machine vision system can also be employed to check for the presence of solder bumps for flip chips and to ensure that die corners are present.

To maintain the thin profile of the invention, camera 160 is directed generally parallel to wafer 105 and perpendicular to the direction of travel of conveyor 170 at a half-silvered mirror 162 (see FIG. 2) which is angled at 45°, for obtaining a normal view of a section of the wafer. A light source 164 having a reflector to direct light horizontally toward the wafer and not up into the camera is disposed behind the half-silvered mirror to illuminated the wafer while minimizing shadows.

Figure 7:
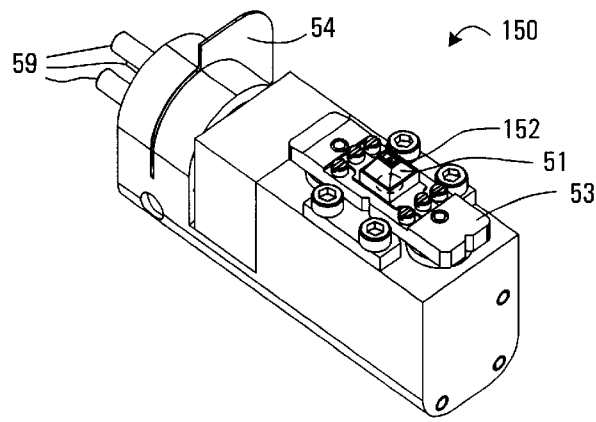
FIG. 7 is a closeup detail of the pick head in perspective.
Figure 8:
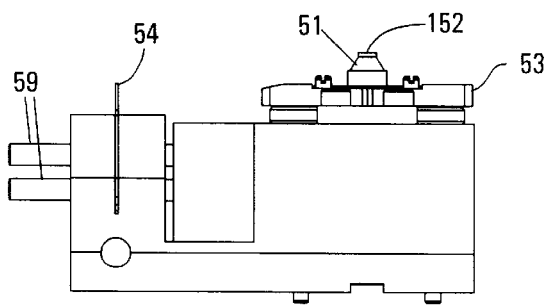
FIG. 8 is an elevation view of the pick head with the pick plate in the retracted position.
Figure 9:
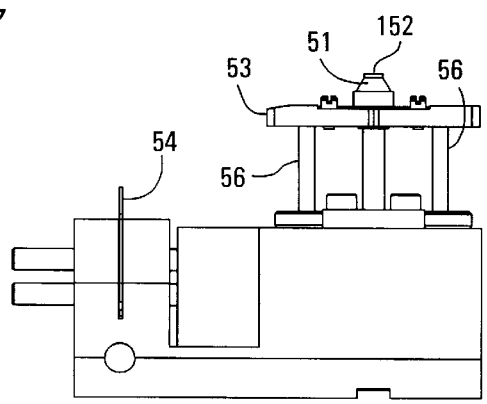
FIG. 9 is an elevation view of the pick head with the pick plate in the extended position.
Figure 10:
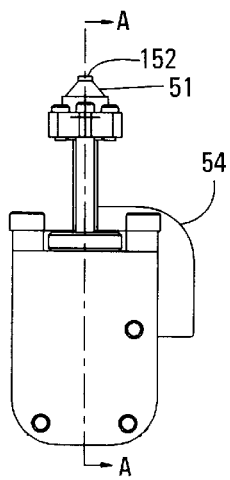
FIG. 10 is profile view of the pick head shown in FIG. 9
Figure 11:
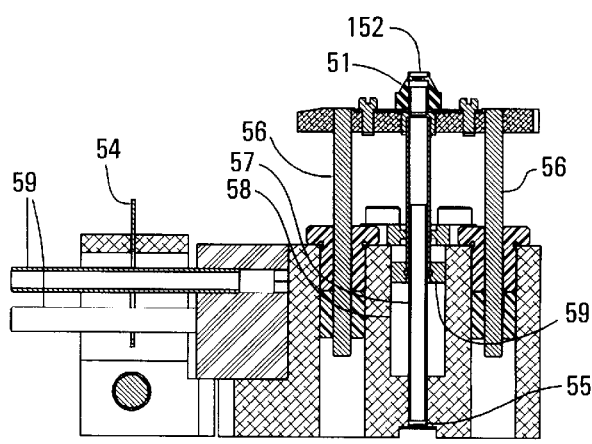
FIG. 11 is a cross-section of the pick head taken at section A—A as seen in FIG. 10.

Once the precise location of a selected known good die is known, fork-shaped support 125 and/or frame 111 is moved to align that die with pick head device 150, which is shown in FIGS. 2 and 3, and shown in detail in FIGS. 7–11. Referring now to FIGS. 7–11, pick head 150 is facing up, revealing interchangeable rubber tip 51 which has a suction port 152 which operates to hold a die against tip 51 when a suction is present inside tip 51. Tip 51 is interchangeable to permit pick head 150 to operate with different sized die, thus the size of port 152 varies with the size and shape of the die to be handled. For reasons that will become apparent, pick head tip 51 is mounted on pick plate 53 which extends as seen in FIGS. 9–11 and retracts as seen in FIGS. 7 and 8. Extension and retraction of pick plate 53 is effectuated via two pneumatic control lines 37 (see FIG. 2) which feed to two pneumatic ports 59 and which feed to cylinder 58 on either side of piston 59. As air pressure is applied to either side of piston 59, plate 53, which rides on guide rods 56, extends and retracts as required. Suction at port 152 is supplied via a third control line 37, and is supplied axially through cylinder 58 and piston 59. Hole 55 (FIGS. 11 and 12*d*) is normally covered during operation, but provides an alignment utility to align pick head 140 with pins of strip head 130.

Turning to FIGS. 13, 13*a*, and 13*b*, the die strip assembly 128 is shown. Strip head 130 rotates on an axis parallel with the plane of wafer 105 and perpendicular with the direction of travel of conveyor 170. Strip head 130 is shown in a non-rotated position in FIG. 13*a* and a rotated position in FIG. 13*b*. The head may be pneumatically actuated or electro-mechanically actuated for rotation so that wafer ring 110, shown in FIG. 38, which is significantly thicker than wafer 105, can pass by the non-rotated strip head 130 during insertion and ejection of the wafer and during vision imaging of wafer 105 at the extreme right side of wafer 105 as seen in FIGS. 2 and 3. By rotating the strip head as shown in FIG. 13*a*, the wafer can be removed while still maintaining the narrow profile of the invention. Guyway 129 provides a means for maintaining control lines within the narrow profile of the invention by passing the control lines over the strip head assembly 128.

Operation of the strip head 130 in extracting die will now be generally described, but die removal is more particularly described below with reference to FIGS. 12a–12e. Dies are removed from wafer 105 in a manner typical in the industry. To extract a die from wafer 105, a vacuum is applied by strip head 130 to the flexible film to stabilize it. Then, a pin or pins 134 push through the flexible film from the rear side, i.e., from within strip head 130, while at the same time, pick head 150 applies a vacuum to the die itself on the front of the wafer. The number and configuration of pins 134 varies with the size and shape of the die. Strip head 130 is removable, and can be replaced with a different sized strip head, such as the smaller one shown in FIGS. 14–17a, and/or having a different pin configuration depending upon the size of the die to be extracted.

Two pneumatic control lines 157 are provided to strip head 130. One of pneumatic control lines 137 provides a vacuum which is applied to the flexible film to stabilize it. The second of pneumatic control lines 137 operates a piston within strip head 130 which in turn operates pin or pins 134. The rotation of strip head 130 may be operated by electro-mechanical rotating actuator 132 (see FIG. 2), which operates in response to a signal 135 from control unit 101, but other motivating means can be used instead.

Figure 14:
FIG. 14 shows a bottom view of the strip head shown in FIG. 13 with the strip head in the rotated position.
Figure 15:
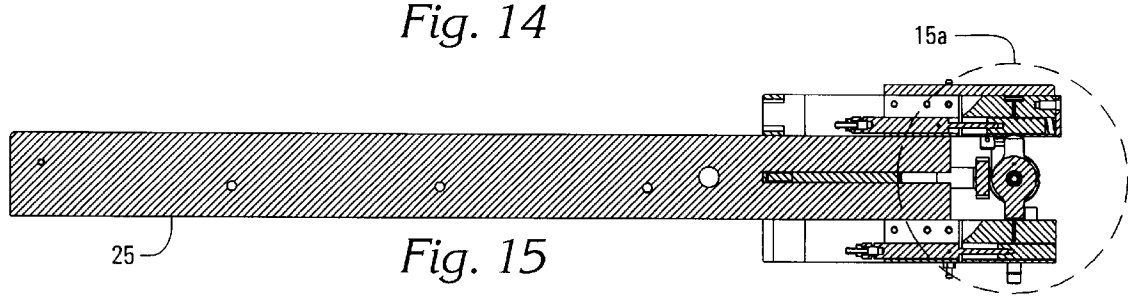
FIG. 15 is a cross section view of the strip arm shown in FIG. 14 taken along section line B—B.
Figure 15A:
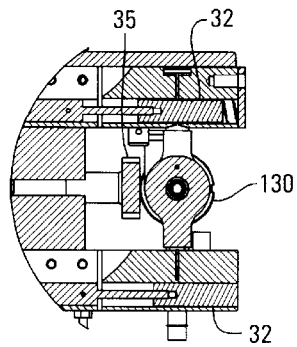
FIG. 15a is a detail of the strip head as shown in cross section in FIG. 15.
Figure 17A:
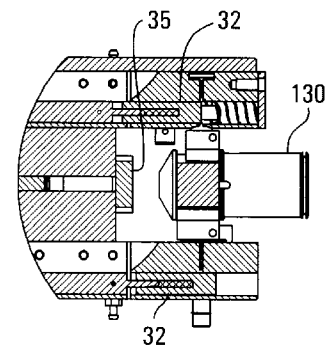
FIG. 17a is a detail of the strip head as shown in cross section in FIG. 17.
Figure 16:
FIG. 16 shows a bottom view of the strip head shown in FIG. 13 with the strip head in its non-rotated position.
Figure 17:
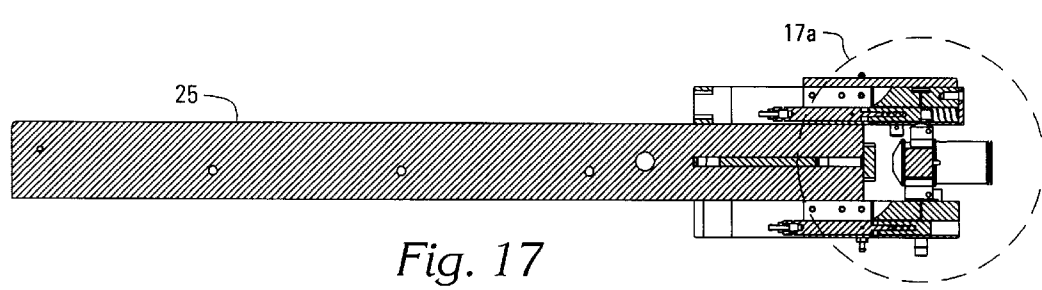
FIG. 17 is a cross section view of the strip arm as shown in FIG. 16 taken on section line C—C.

In the preferred embodiment, pneumatic control is implemented to rotate strip head 130. Pins 134 are actuated pneumatically in response to air vacuum or pressure transmitted via one of control lines 137 from the pneumatic control assembly 106, which is in turn controlled via lines 135 from control unit 101. Although pins 134 are actuated pneumatically in the preferred embodiment, any other type of actuator suitable for the purpose can also be used. FIGS. 14 and 16 show a bottom view of strip arm 25 with strip head in rotated and non-rotated positions respectively. FIGS. 15 and 17 are sectional views of FIGS. 14 and 16 and attempt to show the altered position of rack assemblies 32, shown in detail views 15a and 17a, which respond to pistons which are provided with pressurized air or vacuum, depending on the desired movement. Rack assemblies 32 extend in response to increased air pressure present in respective cylinders, causing pinion gears (not shown) connected to strip head 130 to rotate. To prevent strip head 130 from returning to the non-rotated position, spud 35 extends, engaging a flat surface on strip head 130, thereby preventing unwanted rotation, which is particularly required when auto-loading or auto-ejecting a wafer, which operation is discussed in further detail in the next paragraph.

In addition to functioning to eject die from the flexible film on which the wafer is mounted, strip head 130 serves another important function, which is to partially automate the insertion and ejection of the wafer. Looking now to FIGS. 1 and 37, wafer entry and control doors 82 are shown in the open position. The control doors 82 have guides in the form of grooves 84 which ensure that the wafer is properly aligned to the opening during insertion and removal, minimizing the potential for damage to the wafer. By making the upper door 82 shorter than the lower door 82 it is easy to align wafer ring 110 with grooves 84. Once the wafer is inserted, doors 82 are closed. Control unit 101 senses the position of control doors 82 via door sensor 86. In response to doors 82 being closed, seating of ring 110 inside frame 111 is completed automatically. Fork-shaped support 125, shown in FIGS. 2–4, slides horizontally until strip head 130 is inside ring 110. Strip head 130 then rotates to the rotated position shown in FIG. 6b and slides (with fork 125) in the positive x direction, towards pickup location 173, until the side of strip head 130 engages the inside edge of ring 110.

Strip head 130 then continues to the positive x direction, dragging ring 110 with it until it reaches the fully mounted position shown in FIG. 2. During the wafer ejection process, the strip head 130 performs the same operation in reverse, pushing ring 110 out from outside ring 110, until it can be manually pulled out the rest of the way through doors 82. The invention allows a single wafer to be inserted into the feeder multiple times for short run production, or simply exhausted in a volume environment.

Figure 12A:
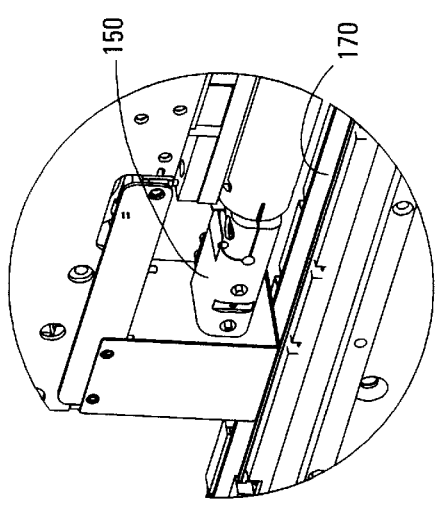
FIGS. 12a, 12b, and 12c show a detail view of the pick head, which rotates to face the wafer in 12a, face down towards the conveyor in FIG. 12b, and face up towards the flip head in FIG. 12c.

Pick head 150 includes a suction port 152, seen in FIGS. 7–11 and 12c, and die strip head 130 includes a pin structure 134. During the die extraction process, the pick head 150 rotates to face the die as shown in FIGS. 5 and 12a and pick head plate 53 extends toward the selected die to place suction port 152 in contact with the selected die. Then the suction port 152 of pick head 150 activates to hold the die against suction port 152 once it is released from the adhesive material. Meanwhile, the strip head 130, in the rotated position shown in FIG. 13b, applies suction to the flexible adhesive film that the wafer is mounted on to stabilize the film using suction ports 132. Then, pins 134 extend from one or more of suction ports 132, through the flexible film to which the selected die is mounted, forcing the selected die from the material and against suction port 152 where it is held by the applied suction. The number of pins utilized and their configuration depends in part on the size of the die to be extracted as is known in the art. Pins 134 then retract and pick head plate 53 retracts, separating the die from the wafer. Due to perforations caused by pins 134 in the film, a strong vacuum is necessary to maintain the film against strip head 130 when removing a die which is adjacent to a recently removed die.

In response to signals 156 to actuator 158, pick head 150 rotates on an axis that is parallel with the direction of travel of conveyor belt 170, allowing pick head to face down to belt 170 or up to flip head 140 after picking a die from wafer 105. Flag 54, shown in FIGS. 7–11, is a simple extension to provide an indication to a feedback sensor (not shown) for confirmation of rotation actuation of pick head 59.

Figure 12B:
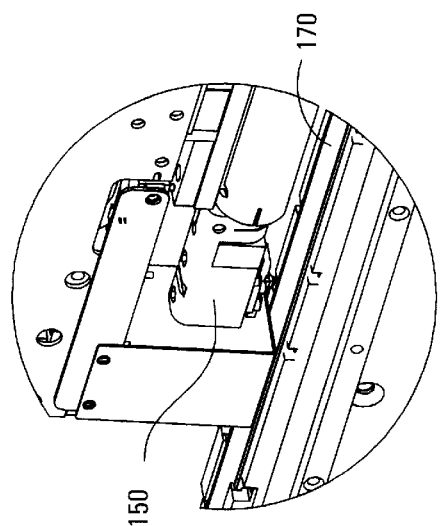

Disposition of the picked die by the pick head depends on whether the die is required to be placed in a circuit up orientation or a "flipped" or circuit down orientation. If the die is required to be placed circuit-up then the pick head 150 rotates 90° down as seen in FIG. 12b. Pick head plate 53 then extends to place the die on conveyor 170 as seen in FIG. 12e, then the die is released by removing suction from port 152 and supplying a puff, or a series of puffs, of air to blow the die off port 152, and finally the pick head plate 53 retracts once more and rotates to face the wafer in preparation to pick the next die. Because frame 111 raises and lowers the wafer in the y-direction, the selected die is always adjacent to conveyor 170 and pick head 150 requires only minimal movement to extract the die from the wafer and place it on the conveyor. Furthermore, since the pick head moves in the x or negative x direction, it can place multiple die on the conveyor without any requirement that the conveyor advance. This permits asynchronous operation between the pick head and the conveyor, and allows the conveyor to operate as a buffer between the pick head operation and the assembly machine retrieving die from the conveyor at pickup location 173.

Figure 12C:
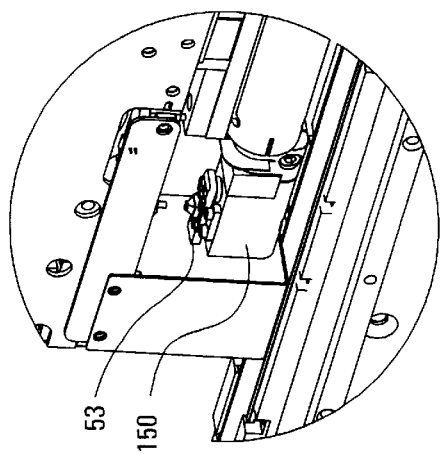
Figure 12E:
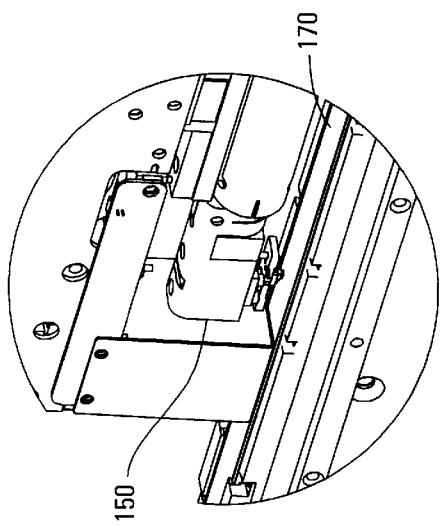
FIG. 12e shows a detail of the pick head rotated to face the belt and extended for placing a die on the belt in the conventional orientation.
Figure 12E:
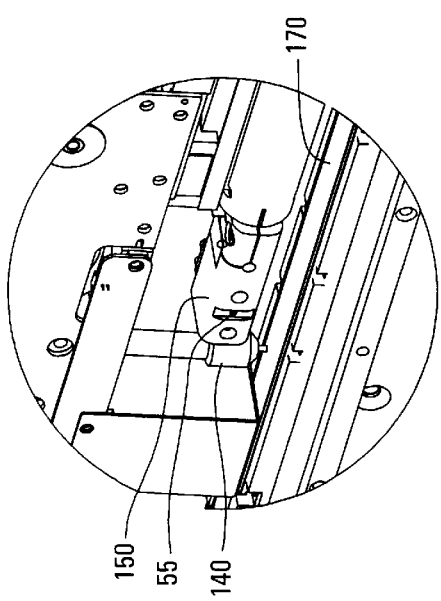

If the die is required to be in a flipped orientation (circuit-down) then the pick head 150 rotates 90° up as shown in FIG. 12c and pick head plate 153 extends upward to place the die in contact with flip head 140 which also has a suction port that is activated when pneumatic control assembly 106 applies a suction to pneumatic control line 187. When the suction port of flip head 140 is activated, suction from port 152 of pick head 150 is removed, thus transferring the die from pick head 150 to flip head 140. Pick head plate 153 then retracts and pick head 150 rotates to face the wafer, ready for the next selected die.

Meanwhile, the entire assembly 145, indicated in FIGS. 2–5 and comprising pick head 150, flip head 140, and machine vision camera 160, shifts to the left under the influence of linear actuator 159 (FIG. 2) so that flip head 140 can drop down past pick head 150 and place the die on conveyor 170. This operation is most easily envisioned by referring to FIG. 2. Linear actuator 159, which may be an electromechanical actuator or a pneumatic actuator, operates to shift support 155 to the left in response to signal 157 from control unit 101. Camera 160, its associated mirror 162 and light source 164, as well as flip head 140 are mounted to support 155 and so they all shift to the left. Flip head 140 then drops to place the die in contact with conveyor 170 as shown in FIG. 12d. After this is done, the suction is removed from flip head 140 to release the die and the flip head retracts to its upper position and assembly 145 and shifts back to the right, ready to receive another die from pick head 150. Parallel processing of the flip and pick operations means the cycle times overlap, maximizing throughput. All control lines, including wires and pneumatic lines, leading to and from components in assembly 145 are provided through flexible guide 90, shown in FIG. 5.

In the preferred embodiment, shown in FIGS. 18–20, flip head 140 is mounted to an elongated tube 141 formed of light-weight titanium having a flat, hardened wear plate 147 along its mid-section. The head and tube assembly shown in FIG. 20 is ultra-light weight to reduce inertial forces. Tube 141 is positioned between four roller-bearings 183 and friction drive roller 182 (see FIG. 18a) attached to pulley 186. In response to signals from control unit 101, stepper motor 188, which is mounted to shift support 155, activates pulley 186 via belt 187. Pulley 186 is connected to friction drive roller 182 which is spring-biased against wear plate 147. Spring biasing is effectuated through mounting drive arm 181 on pivot 184 and biasing mounting drive arm 181 against bear plate 147. Tensioning arm 189 is similarly biased against belt 187 to provide tension to belt 187 through tensioning pulley 185.

When pulley 186 is rotated, the friction drive roller rolls against wear plate 147, causing entire tube 141 to raise or lower. At the top of tube 14 is suction port 144 for supplying suction to flip head 140. Flip head 140 also has a rubber tip 142 at its bottom end which includes a suction port for holding onto a die when its transferred from pick head 150 until it is placed onto conveyor belt 170 and released. Tube 141 also includes a sensor flag 146 for providing feedback to control unit 101 in case of malfunction.

Because dies are released from flip head 140 by applying a puff of air (positive relative pressure), occasionally, adjacent die will move due to the rush of air. To prevent this, a mechanical push-off pin structure, shown in the cross-section view FIG. 18b, is implemented. Flip head 140 includes a cylindrical chamber in which piston 143 having several holes drilled through it around the periphery thereof. Piston 143 also includes a push-off pin 149 extending from its bottom and out through tip 142. During periods of negative pressure, i.e., when holding a die, piston 143 lifts up allowing air to rush in through tip 142 and through holes in piston 143. When a die is being released, a puff of air blows down, causing piston 143 to drop and thereby pushing a die off tip 142 with push-off pin 149.

Figure 22:
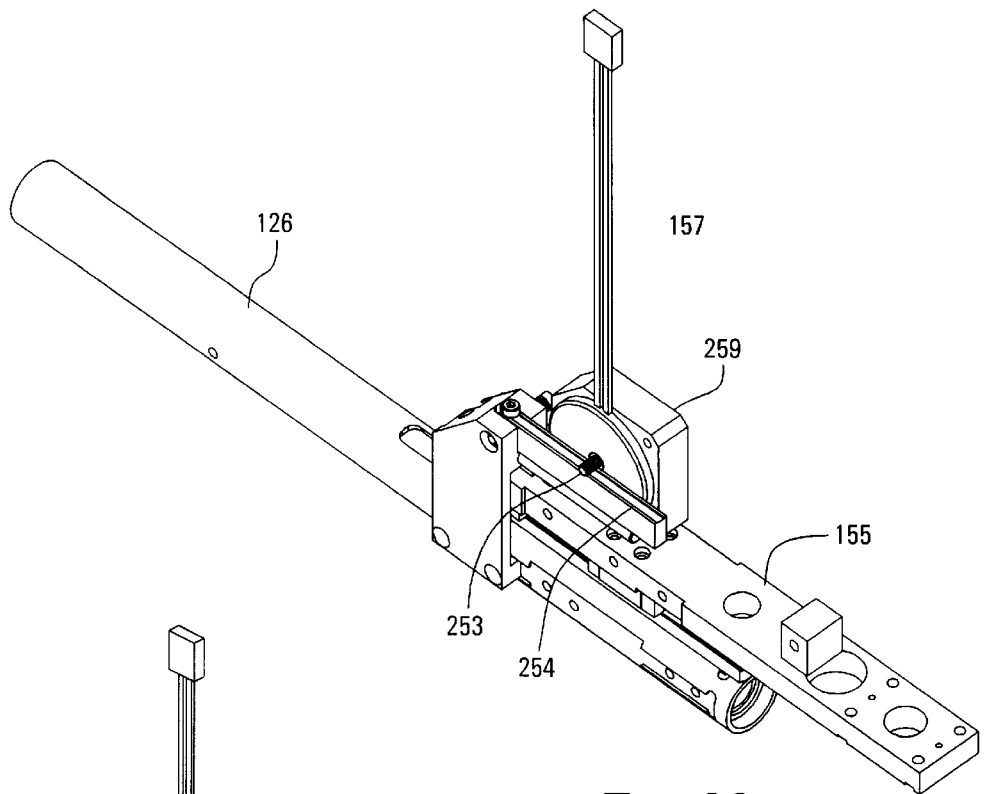
FIG. 22 shows the camera and flip head apparatus shifting mechanism from a reverse angle from the one shown in FIG. 22.
Figure 21:
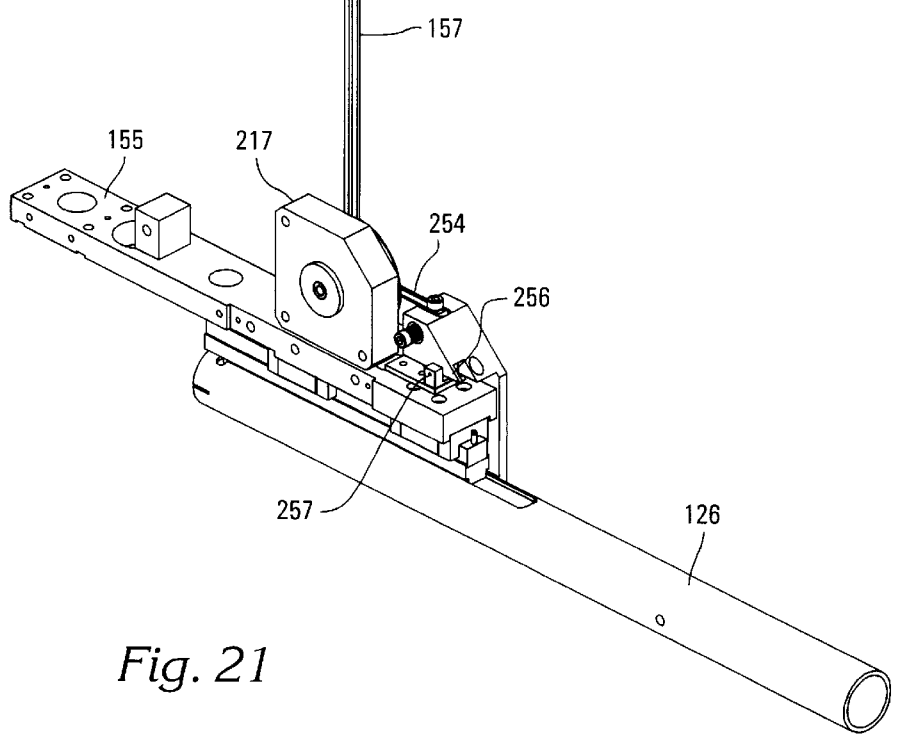
FIG. 21 shows the camera and flip head apparatus shifting mechanism from an angle consistent with the apparatus as shown in FIG. 3.
Figure 23:
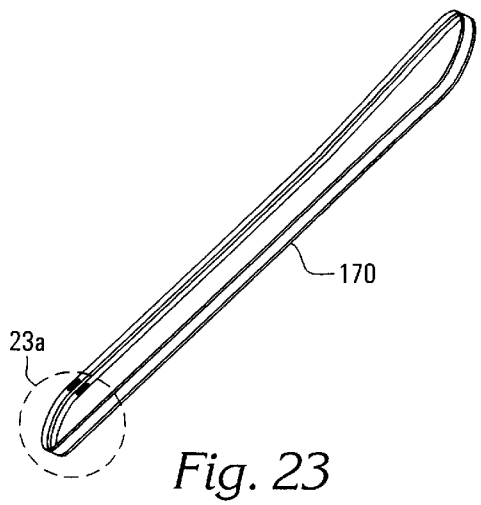
FIG. 23 shows the conveyor belt in perspective view.
Figure 23A:
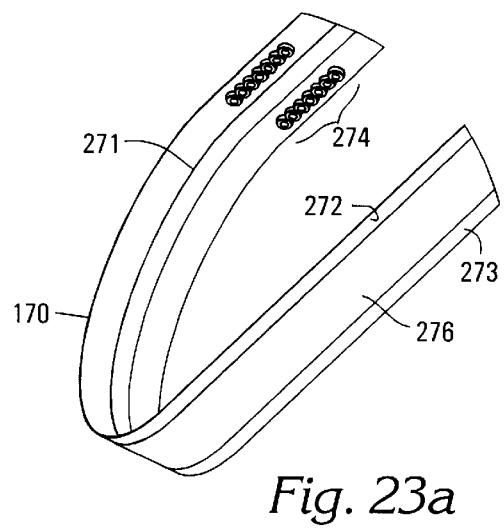
FIG. 23a shows a detail of the conveyor shown in FIG. 23 wherein the structure under the belt, including exemplary guide bumps can be clearly seen.

The shifting mechanism to shift assembly 140 according to the preferred embodiment will now be described with reference to FIGS. 21 and 22. FIG. 21 shows the shifting mechanism from substantially the same perspective as generally seen in FIG. 3, while FIG. 22 shows the same apparatus from a reverse perspective. Shift support 155 moves axially with respect to pick arm support 126. Stepper motor 259 is mounted to shift support 155 while rack gear 254 is mounted to and remains stationary with pick arm support 126. As can be seen, pinion gear 253 extending from motor 259 is engaged with rack gear 254 such that when motor 259 receives signals via line 157 from control unit 101, pinion gear 253 rotates, causing shift support 155 to move relative to pick arm support 126. Sensor 257 detects presence of sensor flag 256 in known manner providing feedback to control unit 101.

Once the die is placed on conveyor 170 and released by either pick head 150 or flip head 160, conveyor 170 may be activated to transport the die to pickup location 176 where stop 174 prevents the die from traveling too far and helps to precisely position the die for pickup.

After the die has been placed on conveyor 170, wafer frame 111 and/or fork-shaped support 125 move into position for the next selected die to be removed. Generally, die are removed from the wafer in a right to left, then bottom to top pattern. Since pick head 150 trails the view point of camera 160 while processing a row of die, the control unit 101 must determine during the processing of a row of die whether the next pick process or vision process should be done first or if both can be done from the same location. Initially, this means that only the vision process will be running for several die, until pick head 150 is also over the wafer. Near the end of the row camera 160 will run off the left end of the wafer but there still may be die in that row for pick head 150 to pick. This further increases the efficiency of the invention by minimizing movement of the pick head 150. When all the known good die in a row has been found and picked, pick head 150 moves back to the right most die in the current row and frame 111 lowers one die interval to the start location of the next row.

Figure 27:
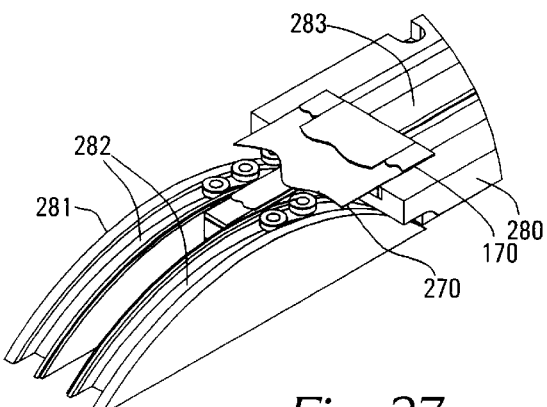
FIG. 27 shows a portion of the rear drive pulley of the conveyor belt with portion of the support and a sample of the conveyor belt itself, showing the interaction between these elements.
Figure 28:
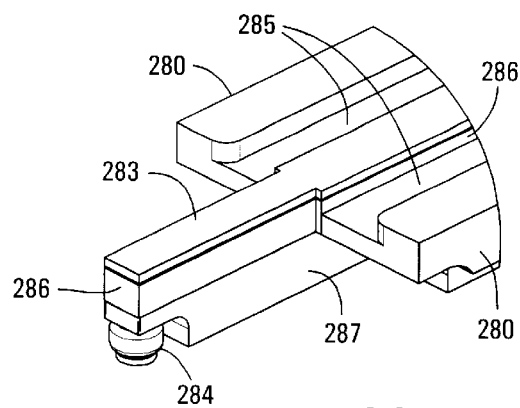
FIG. 28 shows the rear portion of the belt support.

Conveyor belt 170 will now be described with reference to FIGS. 7–10. Motor 177 drives conveyor belt 170 in response to commands from control unit 101. Looking at FIG. 6, Motor 177 drives pinion gear 74 which drives intermediate gear 73, which in turn drives drive gear 72, which is attached to drive pulley 281 (see FIG. 27). Conveyor belt 170 includes steel belt 270, preferably comprising a stainless steel and is advantageously a high yield 300 series stainless steel approximately 4 thousandths of an inch thick (1.0 $\mu$m). Belt 170 is tensioned via tensioning device 179 (FIG. 3). To dampen or prevent vibrations, the belt rides on and is magnetically coupled to a "hard deck" surface discussed in further detail below. A low friction coating 271, such as an ultra high molecular weight polyethylene material is coated or applied with a pressure-sensitive adhesive to steel belt 270 to reduce friction between belt 170 and decking 283 (to be discussed in further detail below with reference to FIGS. 27–32). The combined thickness of polyethylene and adhesive is approximately 0.0065 inches (1.7 $\mu$m). Low friction coatings 272 and 273, on either side on top of steel belt 270 are identical to low friction coating 271 and have the purpose of reducing wear and friction as belt passes reversing structures 172 (see FIG. 3) and pinch points 171 (see FIGS. 3 and 29). Finally, steel belt 270 is provided with an elastomer coating 276 on its top surface to further reduce any migration of die. Elastomer coating 276 is a polyurethane with an elastomer compound to increase the friction between the die and the belt, and preferably has a hardness of Cast-70 Shore A. As with low friction coating 271, elastomer coating 276 is applied to steel belt 270 using a pressure-sensitive adhesive.

Figure 24:
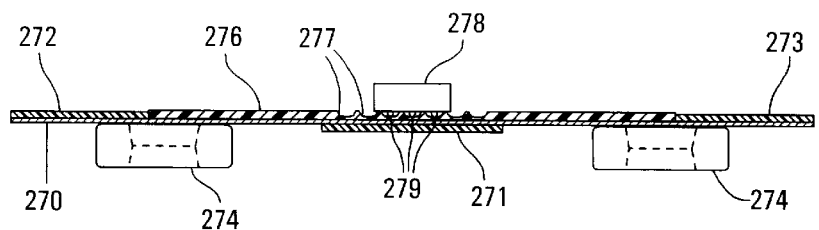
FIG. 24 shows a cross-section view of the belt with a sample die placed on top.
Figure 25:
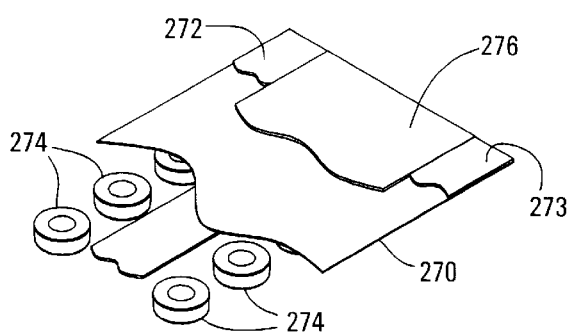
FIG. 25 shows a portion of the belt with various layers removed along its length.

It has been found that, in certain circumstances, and particularly with dies placed in the circuit-up orientation, elastomer coating 276 can create too much adhesion between die and conveyor, causing a die to "stick" to the belt rather than being properly picked up by the host machine. To prevent or mitigate this effect of the coating, grooves 277 (shown in FIG. 24) are ground into the coating to reduce adhesion. FIG. 24 shows a die example 278 which is on the order of 1 mm wide. Die example 278 is a flip chip and includes solder bumps 279 which interface with grooves 277, which further reduces die migration. Grooves 277 will inhibit die migration of flip chips in this manner whether or not solder bumps mesh perfectly with them.

Figure 26:
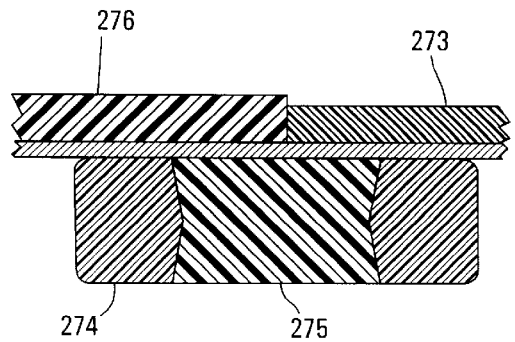
FIG. 26 shows a cross section view of a portion of the belt, the cross section taken through one of the guide bumps.

Guide bumps 274 are attached in two continuous rows along the bottom of steel belt 270. Guide bumps 274 are formed by turning, i.e., machining, or stamping them from a low-friction plastic. Preferably, guide bumps 274 are formed from acetal resin, such as that sold under the trade name Delrin by DuPont. White (virgin) Delrin is most preferably employed. Guide bumps 274 are generally doughnut-shaped and have a inner circumference that is somewhat smaller at its center than at either the top or bottom. This shape allows the guide bumps 274 to form a mechanical connection with glue 275 which holds guide bumps to steel belt 270 (see FIG. 26). Glue 275 is a dual-mode UV-activated acrylic based adhesive having good elastic properties and is thicksotropic, i.e., thick when applied. Glue No. 911, sold by Dymax Corp. of Torrington, CT, has been found satisfactory for this purpose. Longitudinal spacing of guide bumps 274 is not critical, though precise transverse positioning of guide bumps 274 is crucial. As is discussed in more detail below, guide bumps 274 play a key role in ensuring consistent positioning of die for ready retrieval by the host machine.

Referring to FIGS. 27–32, guide bumps 274 are guided along channels 285 formed in deck 270 and grooves 282 formed in rear drive pulley 281 and front free pulley 289. Deck 280 includes guide wheel 284 at the rear end of deck 280 and guide wheel 288 at its front end. Guide wheels 284 and 288 maintain a very small clearance, on the order of 0.001" (0.025 mm), within a central circumferential groove 290 in both front and rear pulleys 79 and 71, respectively. These guide wheels serve to position deck 280 thereby steering the belt into an accurate position on the pulleys, preventing any drift of the belt resulting from its natural camber.

Figure 29:
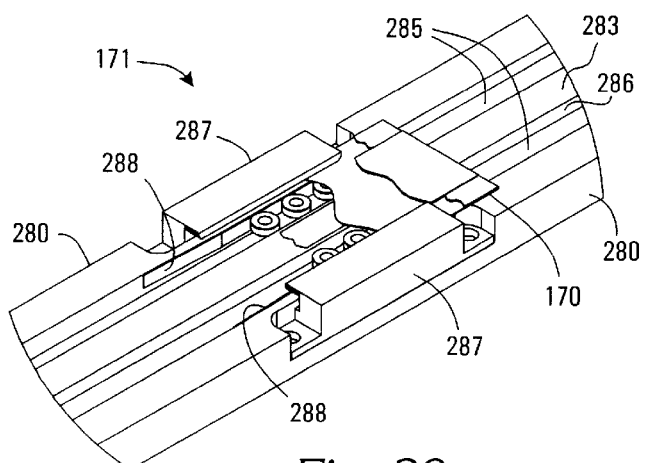
FIG. 29 shows a conveyor clamp or pinch point along the length of the conveyor support which precisely locates the conveyor belt on the z-axis.
Figure 30:
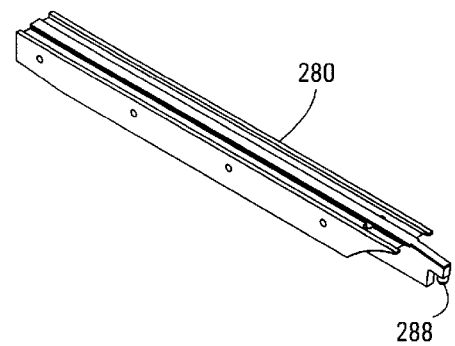
FIG. 30 shows the front portion of the support with guide wheel.
Figure 31:
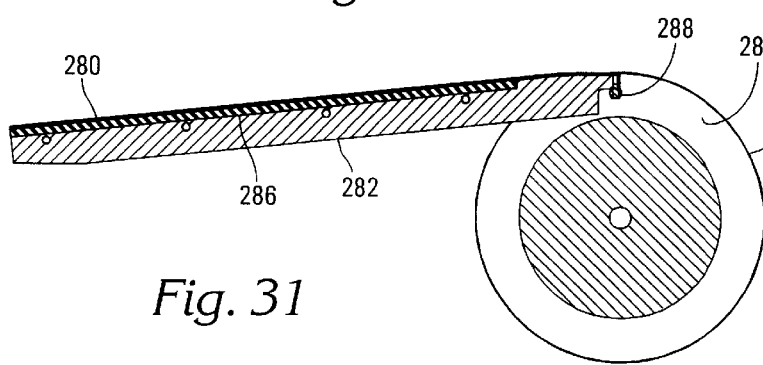
FIG. 31 shows, in a cross-section, the front portion of the support seen in FIG. 30 engaged with the front free pulley.
Figure 32:
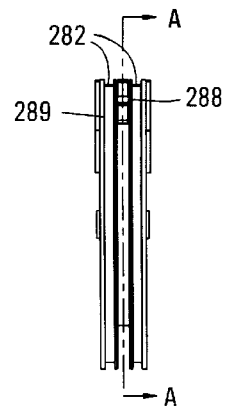
FIG. 32 shows a front view of the front pulley engaged with the front portion of the support.
Figure 33:
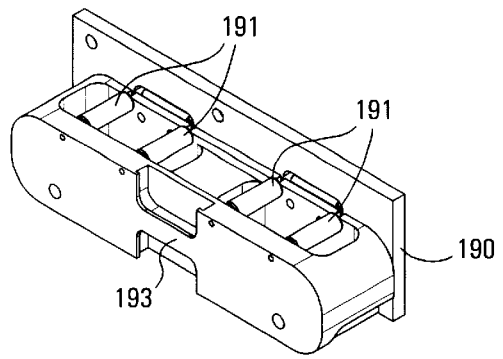
FIG. 33 shows the belt cleaner apparatus in perspective view.
Figure 34:
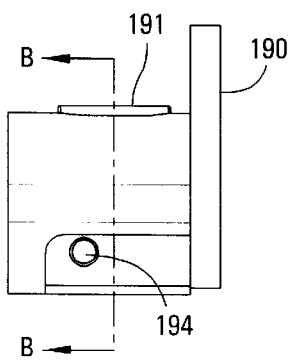
FIG. 34 shows a profile view of the belt cleaner apparatus of FIG. 33.
Figure 35:
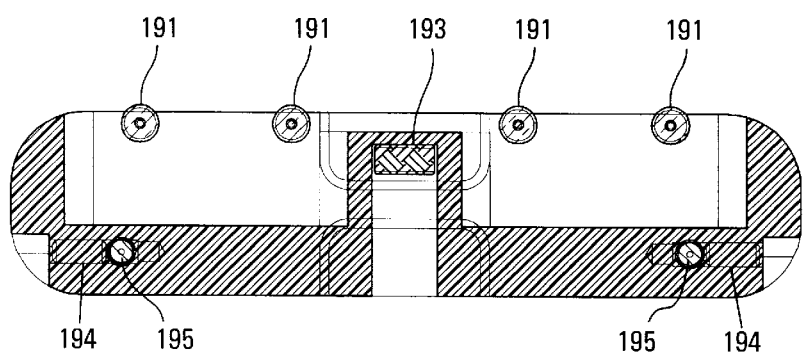
FIG. 35 shows a cross section of the belt cleaner apparatus, the section taken along lines B—B of FIG. 34.

At several key points along the length of the deck, the width of channels 285 is narrowed, forming a choke 288 such as that shown in FIG. 29. Advantageously, these choke points are positioned at either end of drop zone 173 where die may be placed on conveyor 170, and at the pick point 176. At each choke point, channels 75 narrow, precisely locating guide bumps 184 along the z-axis thereby precisely locating belt 170. Clamp 287, shown in FIGS. 3 and 29, hold down conveyor belt 170 at one of chokes 288 to prevent guide bumps 274 from popping out channels 285. Low friction coatings 272 and 273 formed on steel belt 270 reduce friction between clamp 287 and conveyor belt 170.

Between channels 285, decking includes a rubber magnet 286 covered with a low-friction decking material 283 which is preferably acetal resin (DELRIN) and which is laminated, e.g., using pressure-sensitive adhesive onto rubber magnet 286. Rubber magnet 286 is best viewed in FIGS. 28 and 31 and serves the function of magnetically coupling belt 170 to deck 280, thereby preventing and dampening vibrations of belt 170 which may occur perpendicularly to the plane of the belt.

Referring now to FIGS. 1, 3, and 5, ramp section 172 of belt 170 serves the purpose of elevating die from a first height at the drop region 173 to a second height at pickup location 176. The ramp 172 is a necessary and important innovation in the development of a direct die feeder because it permits fork-shaped support 125 to slide back and forth in the direction of the x-axis without extending into a region of space above the conveyor to which the host machine must have access. In other words, without the ramp, drop region 173 would be at the same elevation as pickup location 176, which would necessitate raising fork-shaped support 125 into a fly-zone of the host machine, and the pick and place head of the host machine would inevitably crash into fork-shaped support 125. Belt reversing structures 171 hold conveyor belt 170 down against deck 70 and provide a gentle turn as conveyor belt 170 changes direction from a flat area including drop zone 173 to ramp section 172. Low friction coatings 272 and 273 seen in FIGS. 8 and 9 reduce friction of conveyor belt 170 as it passes against belt reversing structures 171.

Figure 36:
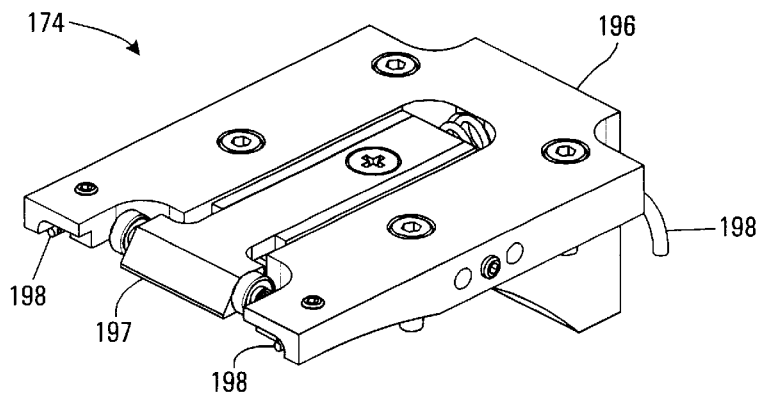
FIG. 36 shows the die stop and sensor in perspective view.

Control unit 101 keeps track of the position of each die on conveyor belt 170 and, depending on the mode of operation, it may be programmed to advance as each die is removed from the pickup location except during the placing operation by pick head 150 or flip head 140. To determine when a die reaches and/or is removed from the pickup location 173, a sensor 176 (see FIG. 2) comprising two photo-emitter optical fiber bundles 198. Sensor 176 includes a light source and a photo sensor (not show) each having one of optical fiber bundles 198 extending to stop 174 shown in FIG. 3 but shown in detail in FIG. 36. Optical fiber bundles 198 extend through openings in stop and fiber bundle support 196 and extend to positions on either side of stop surface 197. The fiber bundles are ground down to form a refracting surface as is known in the art to bend light so that it passes across stop surface 197. When a die is present at pickup location 176 against stop surface 197, light from one fiber bundle to the other is blocked. Ordinarily, upon detection of a die at pickup location 176 control unit 101 over-travels the conveyor belt 170 slightly so as to square the die against stop surface 197 and to knock the die loose from the friction-enhancing polymer surface 276 in case it has become stuck to said surface.

Belt cleaning device 190 will now be described with reference to FIGS. 1, 2, and 17–19. There will inevitably be some silicon particles or other material particles which come in contact with the belt 171 and perhaps stick in place. Additionally, dust is a concern, particularly when supplying chips in a flipped, or circuit-down, orientation since dust and other particles can affect the mechanical and electrical connections between die and substrate after the die is delivered to the host machine. To mitigate dust and other particles from being transferred from belt 170 to the die, a belt cleaner 190 is employed. Belt cleaner 190 includes four nylon brushes 191 mounted adjacent and below the returning portion of conveyor belt 170. Brushes 191 are made from 0.25 inch (6.4 mm) nylon bottle brushes mounted to a twisted wire. Belt cleaner 190 is mounted to posts 195 which have a detent in them which is engaged by a spring-biased ball bearing 194 so that the cleaner snaps onto posts 195. It is easily removed for servicing (e.g., cleaning) by grasping handle 193 and sliding it off posts 195. Additionally, belt cleaner 190 includes a high-strength neodymium magnet 193 to pull the belt into contact with brushes 191 and remove magnetic contamination from belt 170, such as magnetic particles.

The invention having now been described with particularity to a single embodiment, it is understood that the scope of protection sought is limited not by the detailed description above, but by the claims appended hereto.

We claim:

1. A die feeder for feeding in series a collection of components attached to a flexible film having a substantially planar surface, the die feeder comprising:
   a support operable to support said flexible film in the substantially planar configuration;
   a component conveyor belt adjacent to the flexible film and extending substantially horizontally from a location adjacent to said support to a pickup location; and
   a pick head operable to remove a selected component from said collection of components on said flexible film and place said selected component directly on said component conveyor belt at the location adjacent to said support for transport of the selected component by said component conveyor belt to the pickup position.

2. The die feeder set forth in claim 1 wherein said collection of components is arranged in a two dimensional pattern on said flexible film and where said feeder further comprises a means for moving at least one of said pick head and said flexible film so that said pick head has access to every component in said collection of components.

3. The die feeder set forth in claim 2 wherein
   a region of space adjacent to said collection of components is divided by the plane of the substantially planar flexible film into a first side and a second side such that the first side includes said collection of components and extends away from the surface where said collection of components is attached to the flexible film and the second side is one the opposite side of the flexible film and extends away from said first side, where said pick head is located on said first side of said collection of components, said die feeder further comprising:
      a strip head, located on the second side away from said collection of components, said strip head maintaining a position corresponding to said pick head such that an imaginary line extending from said strip head to said pick head is substantially perpendicular to the planar surface of the flexible film, said strip head having a pin structure comprising at least one pin operable to extend from said strip head toward said selected component to release said selected component from said flexible film and pass said selected component to said pick head; and
      where said pick head includes a suction port operable to hold said selected component against said suction port by applying a vacuum to said suction port.

4. The die set forth in claim 3 further comprising a flip head, wherein and said pick head is operable to remove said selected component from the flexible film and place said selected component directly onto said component conveyor belt in a conventional orientation and is also operable to pass the selected component removed from the flexible film to said flip head, where said flip head is operable to take the selected component from said pick head and subsequently place the selected component on said component conveyor belt in a flipped orientation.

5. The die feeder set forth in claim 4, further comprising a piston operating as a pressure-responsive valve disposed within said flip head, said piston lifting to permit air flow through said flip head when a suction is applied to said flip head, and dropping down to a resting position, blocking air flow when positive relative air pressure is applied to said flip head, said piston having a push-off pin axially extending down from said piston through a tip of said flip head only when said piston is in said resting position for mechanically pushing said selected component off said tip without releasing excess air.

6. The die feeder set forth in claim 5 wherein component handling parts including said suction port of said pick head, said pin structure, said strip head, and said flip head are all separately and independently easily removed and interchanged with different sized component handling parts for handling different sized components.

7. The die feeder set forth in claim 4 further comprising a fork-shaped support structure having a first arm for supporting said pick head on said first side of said collection of components and a second arm for supporting said strip head on said second side of said collection of components, said fork-shaped support structure maintaining alignment between said pick head and said strip head.

8. The die feeder set forth in claim 7 further comprising A shifting apparatus mounted to said first arm for shifting said flip head in a direction that is substantially horizontal and substantially parallel with first and second planes, said flip head further comprising means for lowering said pick head to place said selected die on said conveyor belt when said shifting apparatus has shifted said flip head.

9. The die feeder set forth in claim 7 wherein said fork shaped support is mounted for translation only along a horizontal axis that is parallel with said first and second planes and is substantially horizontal and said component support is mounted for translation only along a vertical axis that is parallel with said first and second planes and perpendicular to said horizontal axis, said die feeder further comprising:
   a first automatic positioning motivator for positioning said fork support along said horizontal axis;
   a second automatic positioning motivator for positioning said flexible film along said vertical axis; and
   a conveyor belt motivator for operating said conveyor belt in forward and reverse directions; and
   a machine vision system having a camera mounted to said first arm of said fork shaped support for precisely locating and inspecting said selected component.

10. The die feeder set forth in claim 9 further comprising a control unit controlling said first automatic positioning motivator, said second automatic positioning motivator, said conveyor belt, said strip head, and said pick head to automatically determine a precise location of said selected die, translate said fork support and said flexible film to align said pick head and said strip head with said selected die, stabilize a region of said flexible film surrounding said selected component against said strip head, actuate said pick head by applying suction to said selected component on said selected component's first side, releasing said selected component from said flexible film by actuating said pin structure, and actuating said pick head to place said selected component on said conveyor belt.

11. A die feeder as set forth in claim 9 wherein said machine vision camera further comprises a half-silvered mirror adjacent to said pick head and angled at approximately 45° with respect to said first and second planes, said camera being positioned to direct its line of sight in a direction substantially parallel and aimed at said half-silvered mirror, said half silvered mirror reflecting light from a position adjacent to said pick head on said second plane yet said half silvered mirror also allowing light to pass from a light source located on a side of said half-silvered mirror opposite said position and said camera.

12. The die feeder set forth in claim 3 wherein said suction port is mounted on an extensible pick plate which in turn is mounted on said pick head, said pick head is rotatably mounted and can pivot on a horizontal axis that is substantially parallel with said first and second planes and extends substantially horizontally; said pick head thus operable to remove a selected component from said collection of components on said flexible film and place said selected component on said conveyor belt by pivoting on said horizontal axis to face said first plane, extending said pick plate toward said selected component to bring said suction port in contact with said selected component, applying suction to said suction port to hold said component against said suction port, retracting said pick plate to remove said component from said flexible film, pivot down to face said conveyor belt, extending said pick plate to bring said selected component in contact with said conveyor belt, releasing said component by discontinuing applying suction to said suction port, and retracting said pick plate.

13. The die feeder set forth in claim 3 wherein said flexible film is mounted in a support ring which is significantly thicker than said flexible film and said strip head is rotatable on an axis generally parallel with first and second planes for the purpose of rotating away from said flexible film allowing said support ring to pass during insertion and removal of said support ring and rotating towards.

14. The die feeder set forth in claim 3 wherein said strip head is operable to eject said selected component from said flexible film by first stabilizing a region of said flexible film surrounding said selected component then ejecting said selected component.

15. The die feeder set forth in claim 3 further comprising a fork-shaped support structure having a first arm for supporting said pick head on said first side of said collection of components and a second arm for supporting said strip head on said second side of said collection of components, said fork-shaped support structure maintaining alignment between said pick head and said strip head.

16. The die feeder set forth in claim 15 further comprising A shifting apparatus mounted to said first arm for shifting said flip head in a direction that is substantially horizontal and substantially parallel with first and second planes, said flip head further comprising means for lowering said pick head to place said selected die on said conveyor belt when said shifting apparatus has shifted said flip head.

17. The die feeder set forth in claim 15 wherein said fork shaped support is mounted for translation only along a horizontal axis that is parallel with said first and second planes and is substantially horizontal and said component support is mounted for translation only along a vertical axis that is parallel with said first and second planes and perpendicular to said horizontal axis, said die feeder further comprising:
 a first automatic positioning motivator for positioning said fork support along said horizontal axis;
 a second automatic positioning motivator for positioning said flexible film along said vertical axis; and
 a conveyor belt motivator for operating said conveyor belt in forward and reverse directions; and
 a machine vision system having a camera mounted to said first arm of said fork shaped support for precisely locating and inspecting said selected component.

18. The die feeder set forth in claim 17 further comprising a control unit controlling said first automatic positioning motivator, said second automatic positioning motivator, said conveyor belt, said strip head, and said pick head to automatically determine a precise location of said selected die, translate said fork support and said flexible film to align said pick head and said strip head with said selected die, stabilize a region of said flexible film surrounding said selected component against said strip head, actuate said pick head by applying suction to said selected component on said selected component's first side, releasing said selected component from said flexible film by actuating said pin structure, and actuating said pick head to place said selected component on said conveyor belt.

19. A die feeder as set forth in claim 17 wherein said machine vision camera further comprises a half-silvered mirror adjacent to said pick head and angled at approximately 45° with respect to said first and second planes, said camera being positioned to direct its line of sight in a direction substantially parallel and aimed at said half-silvered mirror, said half silvered mirror reflecting light from a position adjacent to said pick head on said second plane yet said half silvered mirror also allowing light to pass from a light source located on a side of said half-silvered mirror opposite said position and said camera.

20. A die feeder as set forth in claim 15 wherein said fork shaped support is limited in movement to translating only along a first axis that is generally parallel to said planes and generally horizontally disposed.

21. A die feeder substantially as set forth in claim 20 wherein at least one of said first and second arms further comprises an additional support including an extension of said at least on arm to a horizontally extending rail upon which said extension can bear its weight to stabilize and support said at least one arm.

22. A die feeder as set forth in claim 20 further comprising a machine vision system having a camera mounted to said first arm of said fork shaped support for precisely locating and inspecting said selected component.

23. A die feeder according to claim 1 further comprising a frame to support said flexible film, said frame defining the limit in size of said flexible film and said conveyor belt further comprises a deck disposed between two pulleys said conveyor belt slides against said decking and is held in tension by said two pulleys, said conveyor belt extends substantially along side and parallel to said first plane and includes a drop region spanning the width of said frame and extending in one direction beyond said drop region to a pickup location which lies outside of said drop region.

24. A die feeder as set forth in claim 23 wherein said conveyor belt further includes a ramp portion lying between said drop region and said pickup location, said ramp region having an greater slope than said drop region.

25. The die feeder set forth in claim 24 further comprising belt reversing structures at interface between said drop region and said ramp portion to gently curve said belt upward from said drop region, said reversing structures comprising two gently curving overhangs extending a small fraction of the width of said belt over said belt such that edges of an outer surface of said belt slide against said overhangs, and said overhangs hold said belt down against said decking.

26. The die feeder set forth in claim 25 further comprising two continuous strips of low friction material applied to an outer surface and along both edges of said conveyor belt to reduce friction between said belt and said belt reversing structures.

27. A die feeder as set forth in claim 23 further comprising at least one continuous column of guide bumps extending from the bottom of said belt, each said column of guide bumps riding in a respective groove formed in said deck and said pulleys to maintain transverse alignment of said conveyor belt.

28. A die feeder as set forth in claim 27 wherein said at least one continuous column of guide bumps comprises two columns of guide bumps, each bump being generally doughnut shaped with an inner hole having a smaller circumference at its center than at the top and bottom.

29. A die feeder as set forth in claim 28 wherein Said two columns of guide bumps are formed equidistantly from a centerline of said conveyor belt, said decking having two corresponding grooves within which said columns slide, said decking including a rubber magnet covered with low friction material, said rubber magnet disposed longitudinally between said two grooves and operating to hold said conveyor belt against said low friction material.

30. The die feeder set forth in claim 27 wherein said guide bumps are formed from acetal resin.

31. The die feeder set forth in claim 27 further comprising at least one pinch point along said decking, said at least one pinch point comprising a gentle narrowing and widening of said at least one groove to precisely position said guide bumps in the transverse direction, thereby positioning said belt in said transverse direction.

32. The die feeder set forth in claim 31 wherein said at least one pinch point comprises three pinch points, of which one is located near either end of said drop region and one is located near said pickup location.

33. The die feeder set forth in claim 31 wherein at least one of said at least one pinch point further includes a hold-down clamp, said clamp comprising overhangs on either side of said conveyor belt to maintain said at least one column of guide bumps in said respective groove and said conveyor belt against said decking.

34. A die feeder as set forth in claim 23 wherein said conveyor belt is formed of stainless steel, said feeder further comprising a magnet formed in said decking to magnetically couple said conveyor belt to said decking.

35. A die feeder as set forth in claim 23 wherein said two pulleys each include a central groove and said decking includes extensions at either end which extend into a respective central grooves of each of said two pulleys thereby maintaining alignment between said decking and said pulleys.

36. A die feeder as set forth in claim 1, said conveyor belt further comprising an elastomer coating to increase friction between said selected component and said conveyor belt.

37. A die feeder as set forth in claim 36 wherein said elastomer coating comprises polyurethane and is textured to reduce adhesion between said die and said coating.

38. The die feeder set forth in claim 37 wherein said components comprise bumped flip chips and said texture comprises grooves formed in said elastomer coating, said grooves being spaced approximately by the same distance as solder bumps in said flip chips.

39. The die feeder set forth in claim 36 further comprising an ultra high weight polyethylene material applied to said conveyor belt on areas of said conveyor belt that slide against said decking.

40. The die feeder of claim 1 further comprising a belt cleaning device comprising at least one brush disposed adjacent to a returning portion of said conveyor belt, said belt cleaning device further including a magnet for holding said belt against said at least one brush and to aid in removing any metal and magnetic particles present on said belt.

41. A method for removing a component from a flexible film conveying said component to a pickup location using a die feeder, comprising the steps of extracting said component from said flexible film using a pick head;

placing said component directly on a conveyor belt adjacent said flexible film; and operating said conveyor belt to transport said die to a pickup location.

42. The method of claim 41, said step of extracting further comprising locating said component's precise location using machine vision;

positioning a pick head over said component; and removing said component from said flexible film.

43. The method of claim 42 wherein said machine vision includes a camera positioned to the left of said pick head, said method further comprising determining if said locating step or said removing step should be performed next, or whether both steps can be performed from the same position of said camera and said pick head, said step of determining being based on the criteria of which step requires positioning of said camera and said pick head closest to said camera and said pick head's current location after having removed a component from said flexible film or having located a component to be removed.

44. The method of claim 43 wherein said step of locating further comprises employing machine vision to determine if a located die known to be good or bad, and said step of determining includes skipping known bad die.

45. The method set forth in claim 44 further comprising determining if last known good die in a row has been removed, and if so, then positioning said camera at the far right side of next row above current row.

46. The method of claim 44 wherein said step of determining whether a located die is good or bad includes detecting ink dots on known bad die.

47. The method of claim 44 wherein said step of determining whether a located die is good or bad includes determining if said located die is positioned at the same location as a known bad die is located.

48. The method of claim 44 further comprising employing said machine vision to check for the presence of solder bumps if said components are flip chips and to ensure that corners of said components are present.

49. The method of claim 42 wherein said step of positioning further comprises sliding said pick head along a first, substantially horizontally disposed axis, and raising and lowering said flexible film along a second, substantially vertically disposed axis, said first and second axes being substantially parallel to plane defined by said flexible film.

50. The method of claim 41 further including expanding said flexible film by stretching it in all directions, thereby separating said components from one another prior to extracting die from said flexible film.

51. the method set forth in claim 41 wherein said step of placing a die includes rotating said pick head 90° down to face said conveyor belt and placing said die on said conveyor belt.

52. The method of claim 41 wherein said step of operating said conveyor belt includes stopping said conveyor belt when either a component is being placed on said conveyor belt or a die is present at said pickup location.

53. The method set forth in claim 52 wherein said conveyor belt includes a stop at the pickup location and said method of operating further comprises operating said conveyor belt to over-travel when said component reaches said stop to square said component against said stop and loosen said component from a surface of said conveyor belt.

54. The method of claim 53 further comprising determining if said feeder is in a burst mode, and if so, moving said conveyor belt only enough to separate successive components by a small distance as they are placed on said conveyor belt until a predetermined number of die are present and conveying said predetermined number of die to said pick point for feeding said predetermined number of die in rapid succession to a host machine.

55. The method of claim 41 further comprising employing a strip head on an opposite side of said flexible film from said components by stripping said die from said flexible film during said step of extracting, wherein said step of stripping includes stabilizing said flexible film using a suction anvil then pushing at least one pin through said flexible film, pushing said component away from said flexible film.

56. The method of claim 55 wherein said flexible film is mounted in a ring which is thicker than said flexible film, said method further comprising automatically assisting loading said ring through loading doors and into a mounting clamp by rotating said strip head away from said flexible film, translating said strip head to a position within said ring, then rotating said strip head to face said flexible film, then translating said strip head away from said loading doors, engaging an inside rim of said ring, and continuing to translate away from said doors while dragging said ring until said ring is positioned in said mounting clamp.

57. A method of removing components from a flexible film and presenting said components in one of a conventional and a flipped orientation comprising the steps of:

extracting a component from said flexible film using a pick head;

placing said component directly on a conveyor belt if said component is to be presented in a conventional orientation;

passing said component to a flip head then placing the component on the conveyor belt if the component is to be presented in a flipped orientation; and operating said conveyor belt to transport said component to a pick-up location.

58. The method set forth in claim 57 wherein said step of extracting a component from said flexible film and said step of placing said component on the conveyor belt using a flip head are carried out concurrently when said component is to be presented in a flipped orientation.

59. The method set forth in claim 58 wherein said step of extracting a component from said flexible film and said step of operating said conveyor belt occur concurrently when the conveyor belt carries a component and there is no component present at said pick-up location.

60. The method set forth in claim 59 wherein said steps of extracting a component from said flexible film and said steps of passing said component to a flip head occur concurrently with the step of operating said conveyor belt when the conveyor belt carries a component and there is no component present at said pick-up location.

* * * * *